(12) United States Patent
Gruber et al.

(10) Patent No.: US 12,407,354 B2
(45) Date of Patent: Sep. 2, 2025

(54) DIGITAL-TO-ANALOG CONVERTER AND A METHOD FOR REDUCING AGING EFFECTS ON COMPONENTS OF THE DIGITAL-TO-ANALOG CONVERTER

(71) Applicant: Intel Corporation, Santa Clara, CA (US)

(72) Inventors: Daniel Gruber, St. Andrae (AT); Michael Kalcher, Villach (AT); Alessandra Cangianiello, Villach (AT)

(73) Assignee: Intel Corporation, Santa Clara, CA (US)

( * ) Notice: Subject to any disclaimer, the term of this patent is extended or adjusted under 35 U.S.C. 154(b) by 742 days.

(21) Appl. No.: 17/645,462

(22) Filed: Dec. 22, 2021

(65) Prior Publication Data

US 2023/0198533 A1 Jun. 22, 2023

(51) Int. Cl.
*H03M 1/66* (2006.01)
*H03M 1/00* (2006.01)
*H03M 1/06* (2006.01)

(52) U.S. Cl.
CPC ......... *H03M 1/002* (2013.01); *H03M 1/0682* (2013.01)

(58) Field of Classification Search
CPC ...... H03M 1/662; H03M 1/74; H03M 1/0673; H03M 1/66; H03M 3/502; H03M 1/066; H03M 1/0863; H03M 1/1033; H03M 1/1215; H03M 1/745; H03M 1/802; H03M 3/464; H03M 1/00; H03M 1/002; H03M 1/0612; H03M 1/0663; H03M 1/0665; H03M 1/067; H03M 1/1004; H03M 1/1009; H03M 1/1095; H03M 1/12; H03M 1/121; H03M 1/38; H03M 1/466; H03M 1/468; H03M 1/68; H03M 1/687; H03M 1/742; H03M 1/747; H03M 1/808; H03M 3/30; H03M 3/424
(Continued)

(56) References Cited

U.S. PATENT DOCUMENTS

| | | | |
|---|---|---|---|
| 6,344,812 B1 * | 2/2002 | Takeda | H03M 1/0663 341/143 |
| 6,577,261 B2 * | 6/2003 | Brooks | H03M 1/067 341/118 |

(Continued)

OTHER PUBLICATIONS

Daniel Gruber et al.: "10.6 A 12b 16GS/s RF-Sampling Capacitive DAC for Multi-Band Soft-Radio Base-Station Applications with On-Chip Transmission-Line Matching Network in 16nm FinFET," 2021 IEEE International Solid-State Circuits Conference (ISSCC), Feb. 17, 2021, pp. 174-176.

(Continued)

*Primary Examiner* — Linh V Nguyen
(74) *Attorney, Agent, or Firm* — 2SPL Patent Attorneys PartG mbB; Yong Beom Hwang

(57) ABSTRACT

A digital-to-analog converter (DAC). A DAC includes a plurality of DAC cells and a controller. The controller generates a control signal for driving the plurality of DAC cells for each clock cycle. The controller may generate the control signal to select a set of one or more DAC cells for an input code or for a standby mode of the DAC such that the selected set of one or more DAC cells to be active for the same input code or for the standby mode of the DAC change over time without affecting an output of the DAC more than a predetermined limit.

19 Claims, 17 Drawing Sheets

(58) Field of Classification Search
USPC .................................. 341/141, 144, 118–120
See application file for complete search history.

(56) References Cited

U.S. PATENT DOCUMENTS

| | | | | |
|---|---|---|---|---|
| 7,812,751 | B2* | 10/2010 | Eloranta | H03M 1/745 |
| | | | | 341/144 |
| 8,860,597 | B2* | 10/2014 | Sienko | H03M 1/0863 |
| | | | | 341/150 |
| 9,337,854 | B1* | 5/2016 | Chen | H03M 1/0673 |
| 9,543,974 | B1* | 1/2017 | Yang | H03M 1/0863 |
| 9,966,969 | B1* | 5/2018 | Engel | H03M 1/662 |
| 2016/0094235 | A1* | 3/2016 | Kuttner | H03M 1/662 |
| | | | | 341/144 |
| 2020/0112471 | A1* | 4/2020 | Mehrpoo | H04B 1/04 |
| 2020/0313684 | A1* | 10/2020 | Gruber | H03F 3/245 |
| 2021/0021279 | A1* | 1/2021 | Tseng | H03M 1/74 |
| 2022/0407529 | A1* | 12/2022 | Maimon | H04B 1/04 |

OTHER PUBLICATIONS

M. Ershov et al.: "Dynamic recovery of negative bias temperature instability in p-type metal-oxide-semiconductor field-effect transistors", Applied Physics Letters 83, 1647-1649 (2003).

David R. Bild et al.: "Static NBTI Reduction Using Internal Node Control", in ACM Trans. on Design Automation of Electronic Systems, vol. 17, No. 4, Oct. 2012.

J.P. Campbell et al.: "The fast initial threshold voltage shift: NBTI or high-field stress," 2008 IEEE International Reliability Physics Symposium, 2008, pp. 72-78.

John Keane et al.: "An odomoeter for CPUs," in IEEE Spectrum, vol. 48, No. 5, pp. 28-33, May 2011.

* cited by examiner

DIGITAL-TO-ANALOG CONVERTER AND A METHOD FOR REDUCING AGING EFFECTS ON COMPONENTS OF THE DIGITAL-TO-ANALOG CONVERTER

BACKGROUND

The performance of DACs may be substantially degraded over their lifetime by transistor aging and stress effects. This issue is especially critical with high-performance DACs in nanometer complementary metal oxide semiconductor (CMOS) technologies, where these effects severely affect the transistor's characteristics based on their operating conditions. Thus, parameters such as rise- and fall-times, delays, etc. change during a predetermined period of time differently for different parts of the DAC circuit, e.g., branches of differential paths or individual converter cells, which are required to be, and initially were, matched. Thus, the DAC's performance, e.g., linearity and noise, can be severely degraded and even result in violation of the required specifications. Therefore, there is a need for solutions to mitigate the stress and aging effects in high-performance DACs to extend their lifetime in which the specifications, such as linearity and noise, are fulfilled.

A potential solution may be to design the key components of the DAC to tolerate the expected stress and aging effects, e.g., shifts in threshold voltages. In digital or digital-like circuits, this may include a guard-band on the operating frequency, i.e., lowering it, to account for increased threshold voltages due to stress and still fulfill timing. Alternatively, additional circuitry may be added to control the voltages of the internal nodes to reduce stress effects when the circuits are idle. Circuit techniques such as, e.g., switching off differential paths in a single-ended fashion to avoid different operating conditions on the individual paths may be employed to relax the impact of transistor stress and aging effects.

The main disadvantage to the conventional techniques is that it cannot cover all critical DAC circuitries without severely overdesigning the circuit and thus compromising the converter's performance. Guard-banding either reduces the effective frequency or results in overdesigning the circuit, resulting in an increase in area and power. Controlling the internal nodes also introduces a significant overhead in area and in power, due to additional transistors that introduce parasitic and slow down the circuit. Furthermore, no direct design methodology is available to avoid stress effects when different portions of the matched circuit are stressed differently.

Simple measures such as the single-ended switch-off can result in more complicated, otherwise differential, circuitry, implying additional overheads and performance penalties. Additionally, such measures cannot mitigate stress and aging effects when the converter is active and circuit components must remain within their asymmetrical operating conditions.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
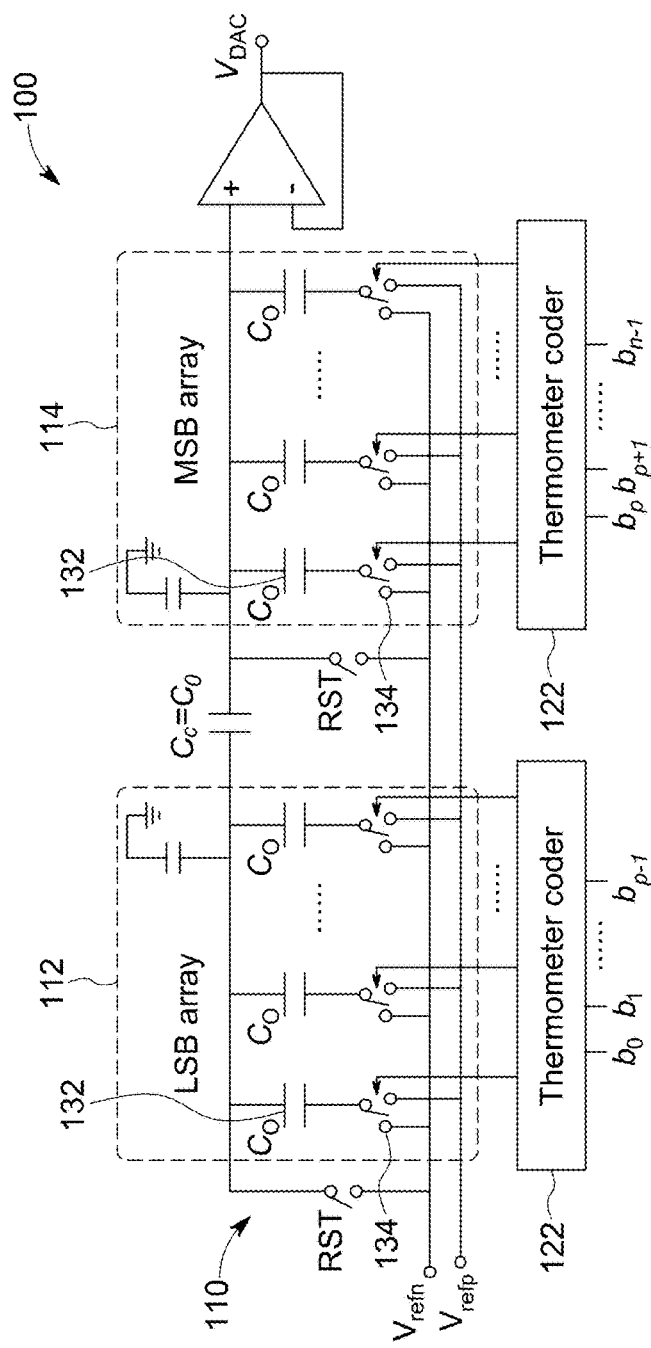
FIG. 1 shows an example capacitive DAC structure.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In examples disclosed herein, the transistor stress and aging effects in a DAC are mitigated by periodically changing the operating conditions of the susceptible transistors in the DAC. Thus, any stress and aging effects between differential paths and/or DAC cells are balanced and do not cause a severe performance degradation over time. These schemes can be applied on the circuit components both when the DAC is inactive (e.g., standby state) as well as in a normal operating state.

The example schemes disclosed herein enable high-performance DACs fulfilling long lifetime requirements in nanometer CMOS technologies where transistor stress and aging effects play a fundamental role. The lifetime can be ensured by circuit techniques that do not compromise performance of the critical DAC circuit components. Furthermore, the degradation of all critical DAC circuitry can be mitigated with the techniques disclosed herein, even when the converter is operating.

FIG. 1 shows an example capacitive DAC structure. In this example, the DAC 100 includes a unary-weighted capacitor array 110 and a thermometer coder 122. The input binary word may be converted to a thermometric code by the thermometer coder 122 to control the switches 134 of the capacitor array 110 to couple either a first reference voltage ($V_{refp}$) or a second reference voltage ($V_{refn}$) to the capacitors 132. In this example, the capacitor array 110 is split into two segments, i.e., the least significant bit (LSB) segment 112 and the most significant bit (MSB) segment 114 and both LSB and MSB segments are unary-coded. Alternatively, the DAC 100 may be segmented into more than two segments, and each segment may be unary-coded or binary-coded. For example, an MSB segment and an intermediate significant bit (ISB) segment may be unary coded and an LSB segment may be binary coded.

Figure 2:
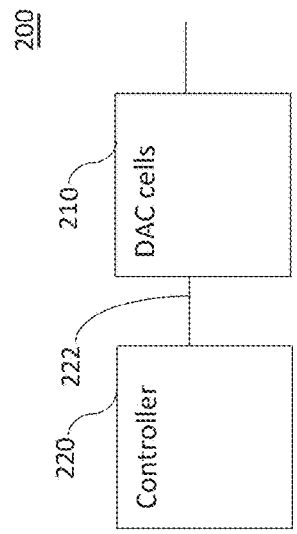
FIG. 2 is a schematic diagram of a capacitive DAC in accordance with one example.
Figure 3:
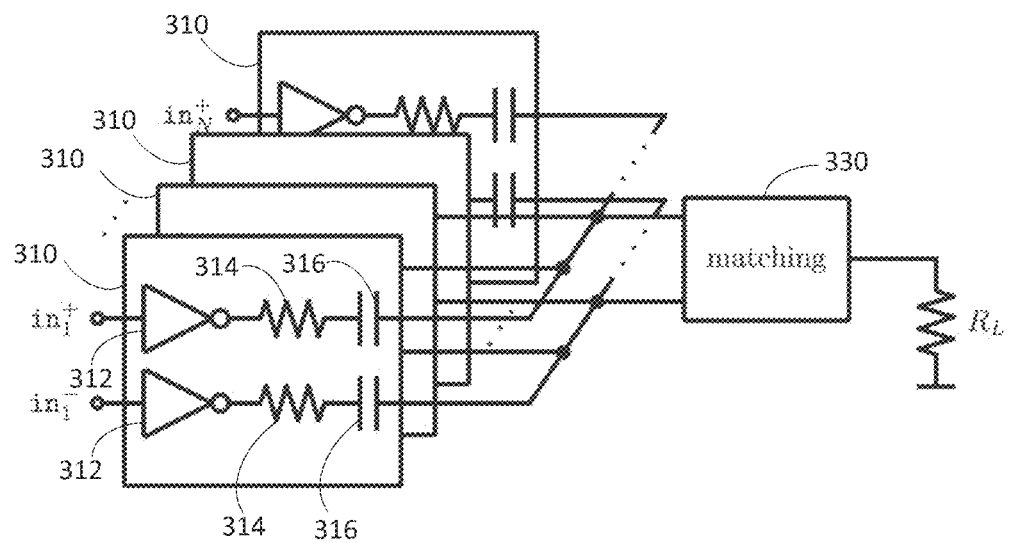
FIG. 3 shows an example of DAC cells of a capacitive DAC.

FIG. 2 is a schematic diagram of a DAC 200 in accordance with one example. The DAC 200 includes a plurality of DAC cells 210 and a controller 220. The DAC cells 210 may be switched capacitor DAC cells, resistive DAC cells such as a weighted resistor DAC or an R-2R ladder resistor DAC, cells of a switched current source type DAC, or the like. The examples disclosed herein may be applied to any type of DACs. In case of switched capacitor DAC, each DAC cell in a capacitor array includes a capacitor and a driver, as shown in FIGS. 1 and 3. One terminal of each capacitor of the plurality of DAC cells 210 is coupled to an output node in parallel and each driver of the plurality of DAC cells is configured to couple either a first reference voltage or a second reference voltage to the other terminal of a corresponding capacitor based on a control signal. The driver may be an inverter-based driver.

The controller 220 receives a binary word or a thermometric code and is configured to generate the control signal 222 for driving the DAC cells 210 for each clock cycle. The DAC cells 210 are driven by the control signal 222 such that each of active DAC cells 210 outputs a corresponding voltage or current toward the output node of the DAC 200. The controller 220 may be configured to generate the control signal 222 to select a set of one or more DAC cells 210 for an input code or for a standby mode of the DAC 200 such that the selected set of one or more DAC cells to be active for the same input code or for the standby mode of the DAC change during a predetermined period of time without affecting an output of the DAC 200 more than a predetermined limit (e.g., the output of the DAC 200 is less than or equal to a predefined threshold). A different set of DAC cells may be selected for different periods of time. The output of the DAC may be the same after selecting/changing a different set of one or more DAC cells during a predetermined period of time. Alternatively, the output of the DAC may be within the allowable limit after selecting a different set of one or more DAC cells. For example, for a 4-bit binary-weighted DAC (or DAC segment), the output may be allowed to change from 8 (0b1000) to 7 (0b0111), or vice versa, resulting in one LSB difference on the output of the DAC. This difference may be tolerable. The DAC cells 210 may have a unary-weighted structure or a binary-weighted structure. The DAC cells 210 may be segmented into two or more segments. Each segment may have a unary-weighted or binary-weighted structure, or any other weighting structure may be used.

In some examples, the DAC cells 210 may further include at least one redundant DAC cell for accurate output of the DAC after switching the set of DAC cells, and the controller 220 may be configured to generate the control signal to select the set of one or more DAC cells to be active for the input code or for the standby mode of the DAC including the redundant DAC cell. The DAC cells may be unary-weighted or binary-weighted, and the redundant DAC cell may be a unary-weighted DAC cell or a binary-weighted DAC cell (e.g., an LSB binary DAC cell). For example, for a 4-bit binary-weighted DAC (or DAC segment), DAC cells 210 including the redundant DAC cell may be switched from 8 (0b1000+0b0) to 8 (0b0111+0b1), or vice versa, to generate the same output.

In some examples, in the standby mode, the controller 220 may be configured to generate the control signal 222 in a way that the set of one or more DAC cells 210 selected for a predetermined level of the output of the DAC 200 change during a predetermined period of time.

In some examples, a frequency of the clock cycle used by the DAC 200 in the standby mode may be substantially lower than a sampling frequency of the DAC 200.

In some examples, the controller 220 may be configured to generate the control signal 222 in a way that the set of one or more DAC cells 210 selected among the plurality of DAC cells is cyclically shifted by a predetermined number of DAC cells periodically.

In some examples, the controller 220 may be configured to generate the control signal 222 in a way that the set of one or more DAC cells 210 selected among the plurality of DAC cells is cyclically shifted by a random number of DAC cells periodically.

In some examples, the controller 220 may be configured to select the subset of DAC cells 210 such that the activation duty cycle of all DAC cells during a predetermined period of time is 0.5.

In some examples, in the standby mode, the controller 220 may be configured to alternatingly select a different half of the DAC cells 210 each subsequent period of time.

In some examples, during a normal operation of the DAC 200 where the DAC 200 generates the output based on the input code, the controller 220 may be configured to generate the control signal in a way that one or more low-indexed DAC cells are swapped with one or more high-indexed DAC cells periodically.

In some examples, in case two or more low-indexed DAC cells are swapped with two or more high-indexed DAC cells, the two or more low-indexed DAC cells and the two or more high-indexed DAC cells may be swapped at the same time. Alternatively, each of the two or more low-indexed DAC cells and each of the two or more high-indexed DAC cells are swapped at different times.

In some examples, the controller 220 may be configured to generate the control signal based on signal statistics and properties of an input signal (e.g., the magnitude of the input signal).

The main aging and stress-related effects in nanometer CMOS transistors, when operating them within their recommended operating conditions, are hot-carrier injection (HCI) and negative bias temperature instability (NBTI). Both effects essentially impact the threshold voltage of the transistors, changing the characteristics of the transistor in a bias dependent manner.

Generally, HCI is present when a (large) current is flowing through a transistor, and individual electrons or holes can damage the gate oxide due to their large kinetic energy. On the contrary, for NBTI no current flow through a transistor is necessary, but a negative gate-to-source and/or gate-to-bulk voltage. Due to this negative bias, positive charges become trapped below the gate without further contributing to the main transistor current flow, effectively raising the threshold voltage. NBTI mostly impacts PMOS transistors since they are operated with negative gate-to-source voltages.

In high-performance DACs, generally HCI impacts matched devices similarly, i.e., equal bias currents or similar currents when switching. However, NBTI impacts matched devices differently, e.g., if certain converter cells are switching less often than others, their transistors may be biased with negative gate voltages for different amounts of time. This effect causes mismatch of the matched transistors over time, thus degrading the converter performance over time.

The critical portions of the DAC circuit are drivers comprising CMOS inverters. FIG. 3 shows an example of DAC cells 310 of a capacitive DAC. Each DAC cell 310 in a differential structure includes a set of an inverters 312 (i.e., inverter-based drivers), a set of resistors 314, and a set of capacitors 314. The outputs of the DAC cells 310 are connected to the matching network 330 for impedance matching. FIG. 3 shows a differential structure, but alternatively, a single-ended structure may be used. All inverters 312 need to be matched to each other. The inverters 312 should be matched amongst themselves in (pseudo-) differential arrangements and/or between a set of matched DAC cells. The buffers are required to provide equal delay and rise- and fall-times and thus are highly sensitive on threshold voltage variations. Therefore, these timing critical circuits are highly susceptible to stress and aging effects.

Figure 4:
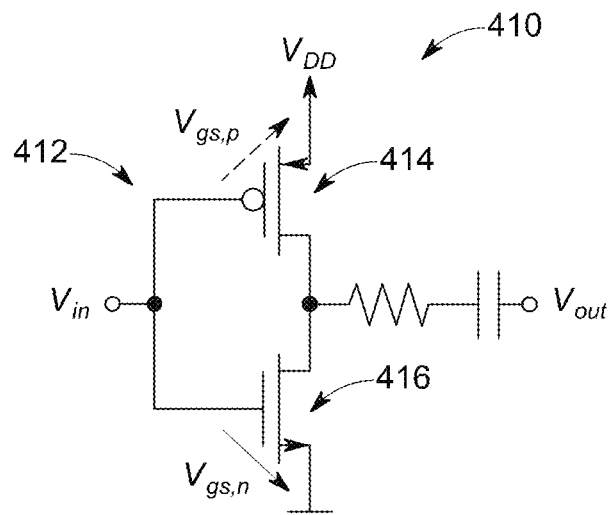
FIG. 4 shows an example single-ended inverter-based driver of a CDAC cell.

FIG. 4 shows an example single-ended inverter-based driver 412 of a CDAC cell 410. The inverter-based driver 412 includes a stacked PMOS transistor 414 and an NMOS transistor 416. The PMOS transistor 414 of the CMOS inverter is especially sensitive to NBTI stress. Its gate-to-source voltage $V_{gs,p}=V_{in}-V_{DD}$. In normal operating conditions, the input voltage $V_{in}$ is confined within 0 V and $V_{DD}$. Thus, the effective gate-to-source voltage is within $-V_{DD} \leq V_{gs,p} \leq 0$ V, which is always negative or zero.

Figures 5A, 5B:
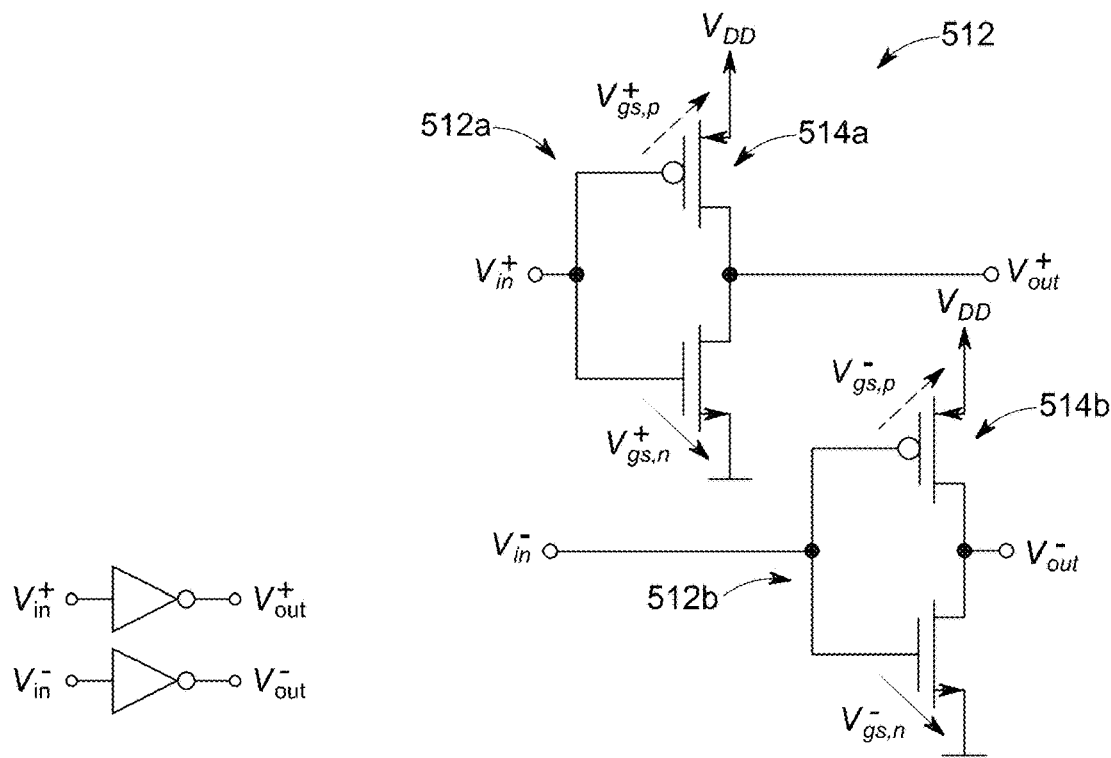
FIGS. 5A and 5B show a block diagram and a circuit schematic of example pseudo-differential inverter-based driver, respectively.

FIGS. 5A and 5B show a block diagram and a circuit schematic of example pseudo-differential inverter-based driver 512, respectively. The differential inverter-based driver 512 includes an inverter 512a in a positive branch and an inverter 512b in a negative branch. In this example, $V_{in}^+$ and $V_{in}^-$ are of opposite polarity and confined by the supply voltages within 0 V and $V_{DD}$. Whenever $V_{in}^+=V_{DD}$, $V_{in}^-=0$ V, and vice versa. Thus, at each time, one of the PMOS transistors 514a, 514b exhibits a negative gate-to-source voltage and therefore is exposed to NBTI stress.

Figure 6:
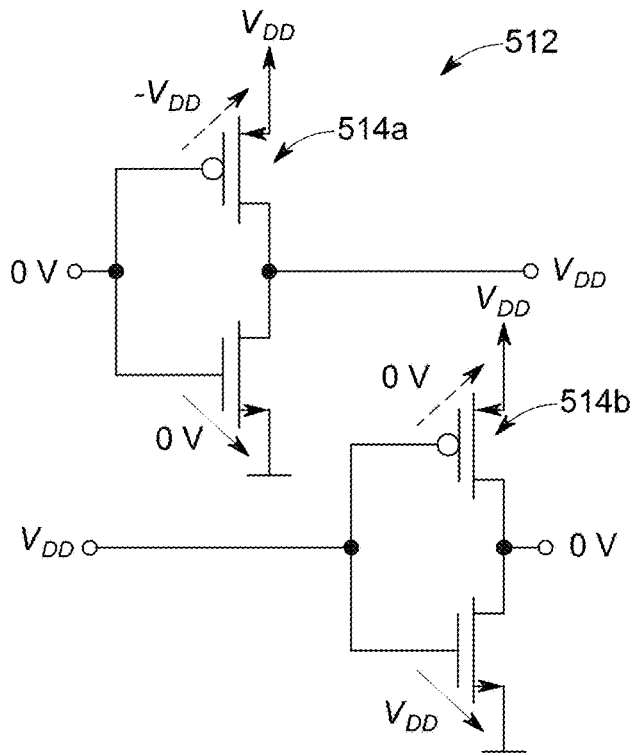
FIG. 6 shows an example case, where $V_{in}^+ = 0$ V and $V_{in}^- = V_{DD}$.

FIG. 6 shows an example case, where $V_{in}^+=0$ V and $V_{in}^-=V_{DD}$. FIG. 6 shows that the PMOS transistor 514a in the positive branch is subject to NBTI stress. The PMOS transistor 514a in the positive branch in FIG. 6 exhibits a negative gate-to-source voltage $V_{gs,p}=-V_{DD}$ and thus is subject to NBTI stress. This situation becomes an issue if it persists for a prolonged period of time, for which then the threshold voltage shifts can become irreversible.

In case the driver is continuously switching, both PMOS transistors 514a, 514b of both branches are exposed to negative gate-to-source voltages. In case the duty cycle of the input signals $V_{in}^\pm$ is d=0.5, e.g., for an ideal clock signal, both PMOS transistors 514a, 514b suffer from NBTI stress for the same amount of time and thus the effect averages out. In this case, the degradation would be symmetric for both transistors and their threshold voltages would be degraded symmetrically. In this case, the transistors' threshold voltages and other parameters would remain matched and may not impact the DAC's performance.

Conversely, in case the driver 512a/512b is not switching, one of the PMOS transistors 514a, 514b is exposed to NBTI stress and its threshold voltage could be degrading. In such case, the two differential paths in FIGS. 5B and 6 would not be matched any longer and thus can cause a severe degradation in the DAC's performance.

Figure 7:
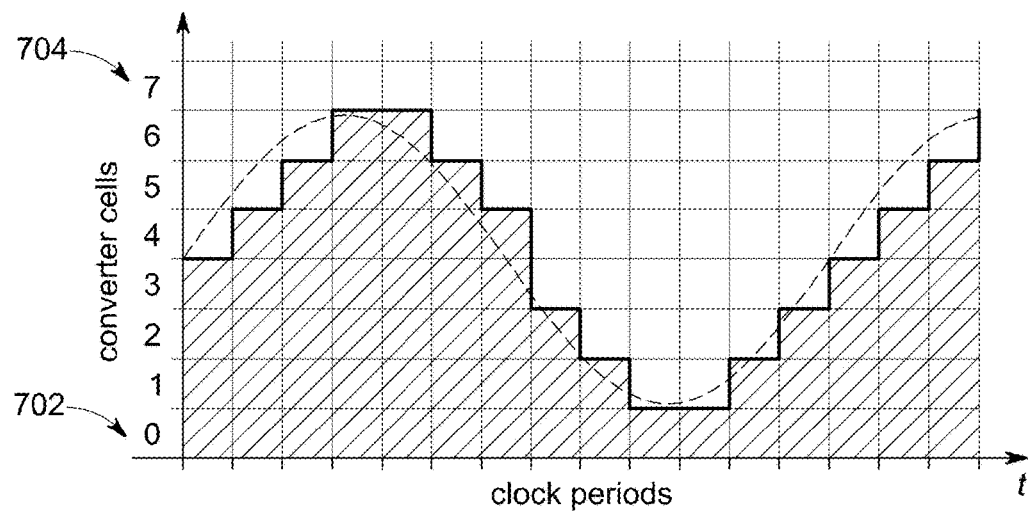
FIG. 7 shows an example sinusoidal input signal to an exemplary 3-bit unary weighted DAC segment comprising eight DAC cells.

A similar problem may also occur among the entire DAC cells, which are also required to match to each other. FIG. 7 shows an example sinusoidal input signal to an exemplary 3-bit unary weighted DAC segment comprising eight DAC cells (converter cells 0-7). In FIG. 7, the shaded areas indicate a logic one, i.e., $V_{in}=V_{DD}$, for each respective clock period and DAC cell.

As shown in FIG. 7, the individual DAC cells switch with different frequencies and duty cycles, which is dependent on the input signal to the DAC. Moreover, dependent on the amplitude of the signal, there are cells, in this example, cells 0 and 7, 702 and 704, that are not switching at all. In the single-ended implementation, cell 0 702 would not be subject to NBTI stress at all, since $V_{gs,p}^{(0)}=0$ V as $V_{in}^{(0)}=V_{DD}$, while cell 7 704 is exposed to NBTI stress the entire time, as $V_{in}^{(0)}=0$ V and $V_{gs,p}^{(0)}=-V_{DD}$. In case of a differential implementation, one of differential paths within cells 0 and 7 would always be exposed to NBTI stress over a prolonged period of time.

Figure 8:
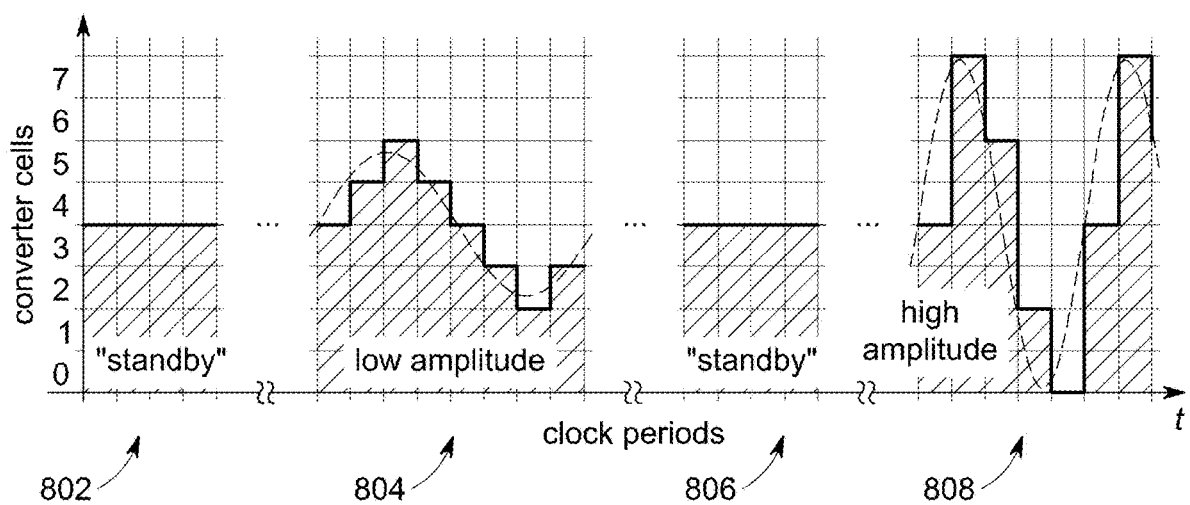
FIG. 8 shows an example signals and cell activity over a longer period of time alternating with periods in which the DAC is in a standby mode and periods in which the DAC is in a normal operation.

FIG. 8 shows an example signals and cell activity over a longer period of time alternating with periods 802, 806 in which the DAC is in a standby mode and periods 804, 808 in which the DAC is in a normal operation. The example in FIG. 8 is for a 3-bit unary weighted DAC segment comprising eight cells (cells 0 through 7). In FIG. 8, the shaded areas indicate a logic one (e.g., $V_{in}=V_{DD}$) input to the positive branch of the cells in the respective clock periods.

In FIG. 8, normal operation modes with signals of different amplitudes are alternated with the standby mode of the DAC. In the standby mode, the DAC output may be kept at the mid-scale (e.g., its virtual zero) to keep other processing circuitry properly biased. Such a scenario is usually found in time division duplex (TDD) systems, where reception and transmission are alternated, or generally, when the DAC is kept ready to transmit whenever needed.

During the standby mode 802, 806, the cells 4 through 7 in the example are fully suffering from the NBTI stress in case of single-ended implementation. Thus, when a signal is converted by the DAC, its portion converted by cells 4 through 7 would exhibit different delays and rise- and fall-times compared to the portion covered by cells 0 through 3. This asymmetry causes a severe degradation in the output spectrum of the DAC.

As shown in the example in FIG. 8, additionally during the normal operation 804 with the low amplitude signal, cells 6 and 7 remain fully exposed to the NBTI stress, thus degrading them even further. In the example, during the normal operation 808, the high amplitude signal will be converted by cells that were exposed to NBTI stress for different amounts of time, and thus exhibit different delays and rise- and fall-times, which further degrades the DAC's output spectral performance.

In case of a differential DAC, this issue remains, as the differential paths of the individual converter cells are exposed to NBTI stress in a different manner, as explained above.

Some solutions to mitigate stress and aging effects may include overdesigning them, i.e., to consider the stress-related increase in threshold voltages at the design time. This approach is especially feasible for digital and digital-like circuits, where only timings need to be considered. If timings as well as analog characteristics, i.e., delays and rise- and fall-times, need to match between individual paths or cells as required in a high-performance DAC, this approach is unfeasible, since overdesign alone cannot guarantee equal stress on the individual devices. Furthermore, this approach greatly increases area and power consumption.

Figure 9:
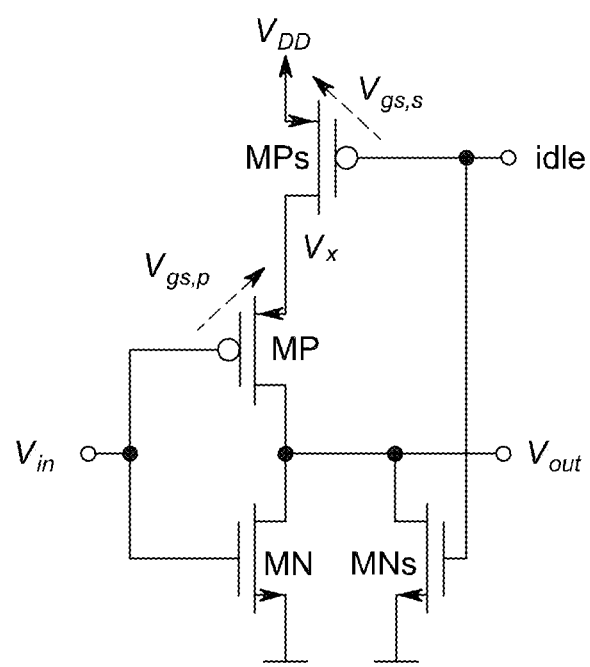
FIG. 9 shows an example circuit for an inverter with internal node control to reduce NBTI stress.

Another solution to reduce the NBTI for digital and digital-like circuits is to control the voltage of internal nodes. FIG. 9 shows an example circuit for an inverter with internal node control to reduce NBTI stress. Additional switches MPs and MNs are introduced, which can reduce the NBTI stress effects on both PMOS transistors MP and MPs, when the circuit is in an idle state and the idle signal is active, i.e., idle=$V_{DD}$. Independently of the input voltage $V_{in}$, since the node $V_x$ is either floating ($V_{in}=V_{DD}$) or pulled to ground ($V_{in}=0$ V), both PMOS gate-to-source voltages are zero. Thus, NBTI stress can be avoided when the circuit is idle.

Apart from the circuit overhead, increased area, and additional on-resistances and parasitic capacitances, this solution can only mitigate the NBTI stress when the circuit is in the idle mode with the respective signal properly set. Thus, this solution is not feasible to compensate for different operating conditions in matched circuits as found in a high-performance DAC.

Other simple mitigation techniques are, e.g., the single-ended switch-off, where both branches of a differential path are not supplied with a differential input signal but equal polarities. For example, for the (pseudo-)differential driver shown in FIG. 5B, both $V_{in}^+=V_{in}^-$ are set to an equal voltage, either to 0 V or to $V_{DD}$. This way, the stress is applied symmetrically to both PMOS transistors 514a, 514b in the drivers of both differential paths. This method is only applicable when the circuit is switched off or in an idle state. If different (pseudo-) differential matched drivers need to be protected from NBTI stress, all of their inputs need to be kept at the same level. Therefore, to apply this technique in the previous example shown in FIG. 8, the mid-scale output during the standby mode cannot be kept, since this requires different input signals for the different DAC cells.

Examples solutions to avoid or reduce NBTI stress and aging effects in high-performance DACs are explained in detail for both a standby mode and a normal operating condition of a DAC. The example schemes to reduce the NBTI stress on the sensitive DAC circuitry include the individual matched converter cells and/or the clock distribution internal to the DAC, which may include (pseudo-differential) frequency dividers, clock gates, drivers and several other circuits.

Examples to avoid or reduce NBTI stress and aging effects in the standby mode of a DAC are explained hereafter. In the standby mode of the DAC, the DAC is kept in a state ready to operate within a very short time (e.g., several high-speed clock cycles), but, if applicable, put into a power saving mode.

In the standby mode, a low frequency clock signal may be supplied to the DAC, and the matched circuitry in the DAC, such as the individual DAC cells, may be operated with the low frequency clock, which saves a considerable amount of power. The frequency ($f_{idle}$) of the low frequency clock may be a fraction of the DAC's regular sampling clock frequency, e.g., $f_{idle}=f_{clk}/R_{idle}$. The ratio $R_{idle}$ may be an integer or a fraction but may be any positive number, and, for example, may exceed 1,000. For this example, this ratio implies a frequency of $f_{idle}=16$ GHz/1000=16 MHz, which can be further reduced for the standby mode. To perfectly balance out any asymmetry, a duty cycle of d=0.5 may be chosen for this low frequency clock. Such a choice is especially important when irreversible NBTI stress effects are present.

In the standby mode, the input data to the DAC may be kept constant at the desired virtual zero level, (e.g., at its mid-scale), as shown in FIG. 8. To counter the asymmetric NBTI stress on the circuit, the DAC cells that are active during the standby mode may be varied without effectively changing the DAC's output value. This may be achieved by rotating, shuffling, scrambling, or applying other modifications to the allocation of active DAC cells (e.g., by dynamic element matching (DEM)-like algorithms). The active DAC cells may be allocated to achieve a duty cycle of d=0.5 for each individual DAC cell.

Figure 10:
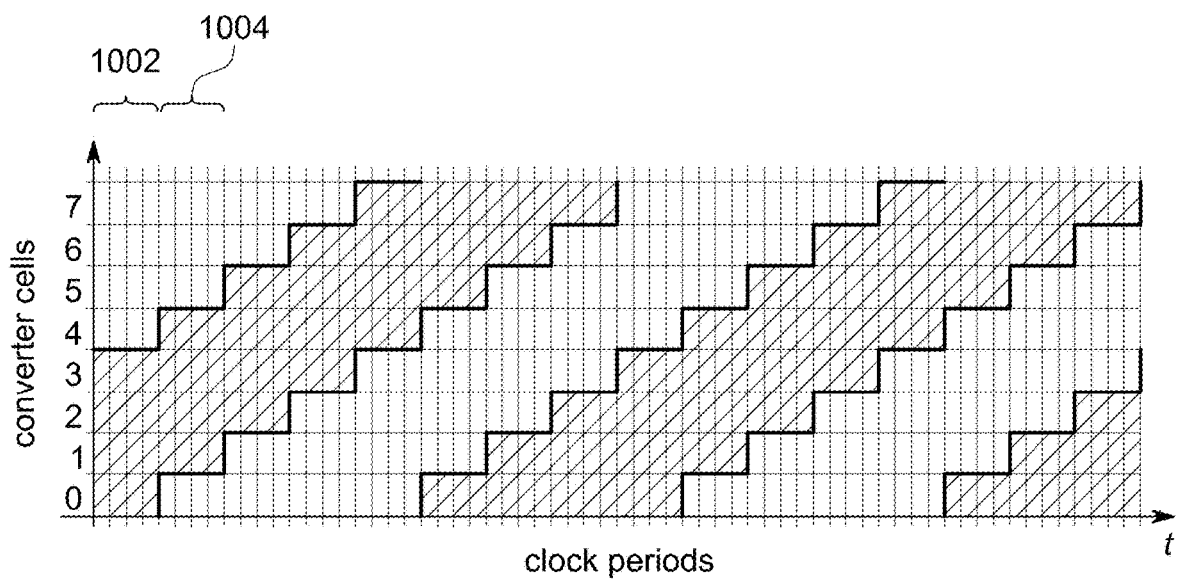
FIGS. 10 and 11 show examples of signals and cell activity for the standby mode for a 3-bit unary weighted DAC segment comprising eight cells.

FIG. 10 shows example signals and cell activity for the standby mode for a 3-bit unary weighted DAC segment comprising eight cells (cells 0-7) including one redundant cell in accordance with one example. In FIG. 10, the shaded areas indicate a logic one (e.g., $V_{in}=V_{DD}$) input and the unshaded areas indicate a logic zero (e.g., $V_{in}=0$) input to the positive branch of the DAC cells in the respective clock periods. For the negative branch of the DAC cells, the inputs are complementary. In this example, to counter the asymmetric NBTI stress, the DAC cells are alternated or varied in a cyclic fashion periodically, e.g., cyclically shifted for each clock period by a certain number of DAC cells ($n_{idle}$). In the example shown in FIG. 10, for the first period 1002, cells 0-3 are activated and for the second period 1004, the activated cells are shifted by 1 such that cells 1-4 are activated, and so on. In FIG. 10, the allocation of DAC cells is cyclically rotated by an increment of $n_{idle}$ ($n_{idle}=1$ in the example but may be any integer) at each clock cycle. The clock frequency in the standby mode may a low frequency clock cycle as explained above. $R_{idle}=4$ in this example. With this approach, a duty cycle of d=0.5 may be obtained for each of the DAC cells.

Figure 11:
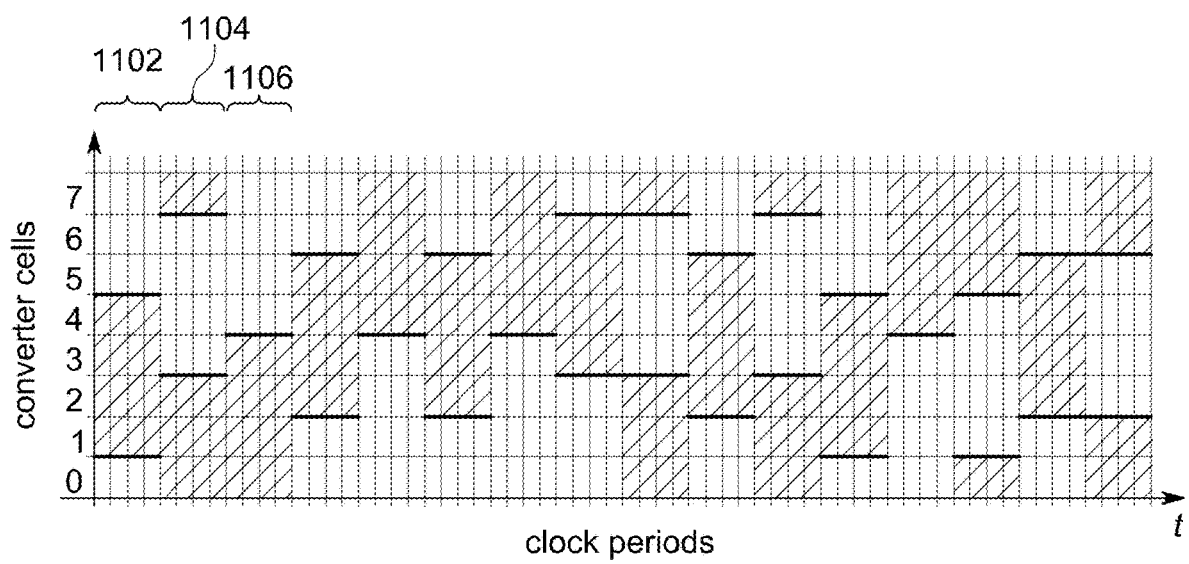

FIG. 11 shows an alternative example for signals and cell activity for the standby mode for a 3-bit unary weighted DAC segment comprising eight cells (cells 0-7). The shaded areas indicate a logic one (e.g., $V_{in}=V_{DD}$) input and the unshaded areas indicate a logic zero (e.g., $V_{in}=0$) input to the positive branch of the DAC cells in the respective clock periods, and the input to the negative branch is complementary. In this example, to counter the asymmetric NBTI stress, the active DAC cells in the standby mode are cyclically rotated in a random fashion. The cyclic shift in each clock period is randomly selected. In this example, for the first period 1102, cells 1-4 are activated and for the second period 1104, the activated cells are shifted by −2 (or +6) such that cells 0-2 and 7 are activated, and for the third period 1106, the activated cells are shifted by 1 such that cells 0-3 are activated, and so on.

In this example, while the instantaneous duty cycle is not necessarily 0.5 for each DAC cell, when choosing the random sequence controlling the allocation correctly, the average duty cycle (d) will be 0.5 as required to avoid permanent asymmetric NBTI stress effects.

Alternatively, different algorithms may be used to counter the asymmetric NBTI stress. Furthermore, other methods to change the DAC cell allocations other than a rotation of the active DAC cells may be chosen. For implementations, there might be an advantage when using cyclic rotations as this may reduce the implementation complexity and effort.

Since all the converter cells are matched, the output amplitude should not be affected by any of these schemes. Nonetheless, due to, amongst others, process-related mismatch, a very small residual mismatch signal may remain, as well as very small signals related to the switching activity. In general, it can be assumed that such very small random signals can be tolerated during the DAC's idle mode.

The choice of $R_{idle}$, $n_{idle}$, as well as the aging effect reduction schemes disclosed herein can reduce any unwanted signal during the standby mode, e.g., providing noise shaping, or translating the unwanted energy to a band of frequency which is not of interest, i.e., filtered out.

Example schemes to avoid NBTI stress and aging effects during normal operations of a DAC will be explained hereafter. As explained above with reference to FIGS. 7 and 8, during the normal operation of the DAC several PMOS transistors can experience prolonged periods of NBTI stress. Due to the mid-scale being the virtual zero of the DAC, some DAC cells with low indices and high indices may not be switching and thus exposed to NBTI stress. In examples, in order to counter the asymmetric stress on these DAC cells, these cells (e.g., some DAC cells with low indices and high indices) may be switched, without contributing to the DAC's output signal.

Figure 12A:
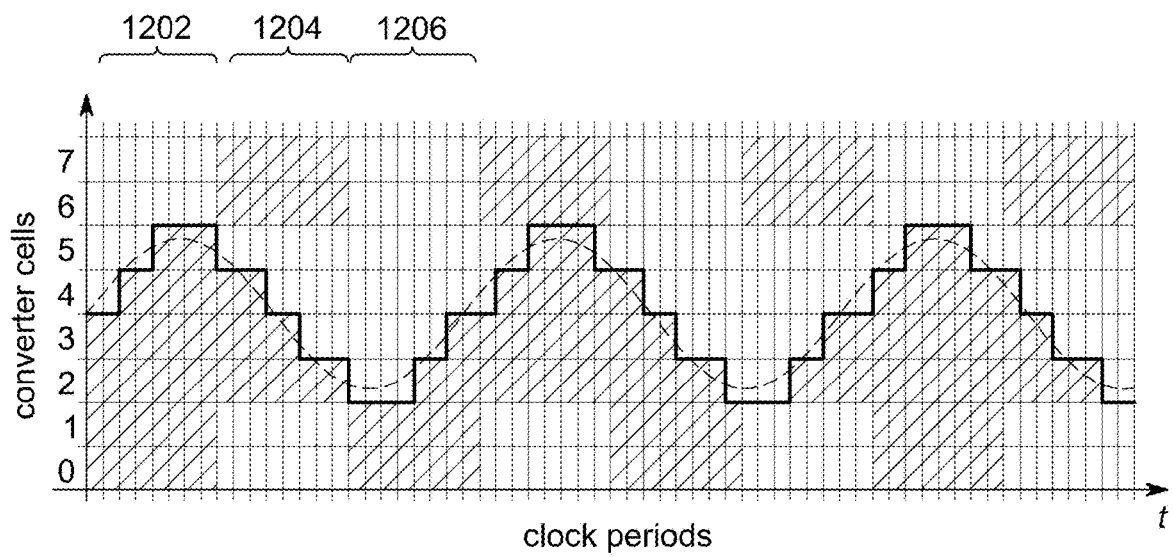
FIGS. 12A and 12B show examples of signals and cell activity for the switching of inactive DAC cells for a 3-bit unary weighted DAC segment comprising eight cells.

FIG. 12A shows an example of signals and cell activity for the switching of inactive DAC cells for a 3-bit unary weighted DAC segment comprising eight cells (cells 0-7). The shaded areas indicate a logic one (e.g., $V_{in}=V_{DD}$) input to the positive branch of the cells in the respective clock periods, and the input to the negative branch is complementary. In this example, to counter the asymmetric NBTI stress, the inactive cells' states are exchanged periodically between the low-indexed and high-indexed cells. In the example shown in FIG. 12A, without the state change, cells 0 and 1 will be active at all times and cells 6 and 7 will be inactive at all times. In this example, the states of the low-indexed cells (e.g., cells 0 and 1) and the high-indexed cells (e.g., cells 6 and 7) are switched periodically. For example, during the period 1202, cells 0 and 1 are active and cells 6 and 7 are inactive, and during the period 1204, the status of cells 0/1 and 6/7 are switched such that cells 0 and 1 are inactive and cells 6 and 7 are active, and during the period 1206, the status of cells 0/1 and 6/7 are switched again such that cells 0 and 1 are active and cells 6 and 7 are inactive, and so on. This way, each of the inactive cells (e.g., cells 6 and 7 in this example) exhibit a duty cycle of d=0.5, effectively counteracting the asymmetric NBTI stress. The sum of these cells' output signal is zero, and thus does not contribute to the output signal as expected.

The frequency of exchanging the states of the individual cells may be chosen based on the residual signal due to process variations of the cells. Furthermore, the lower this frequency, the lower the power consumption due to this additional switching activity.

Figure 12B:
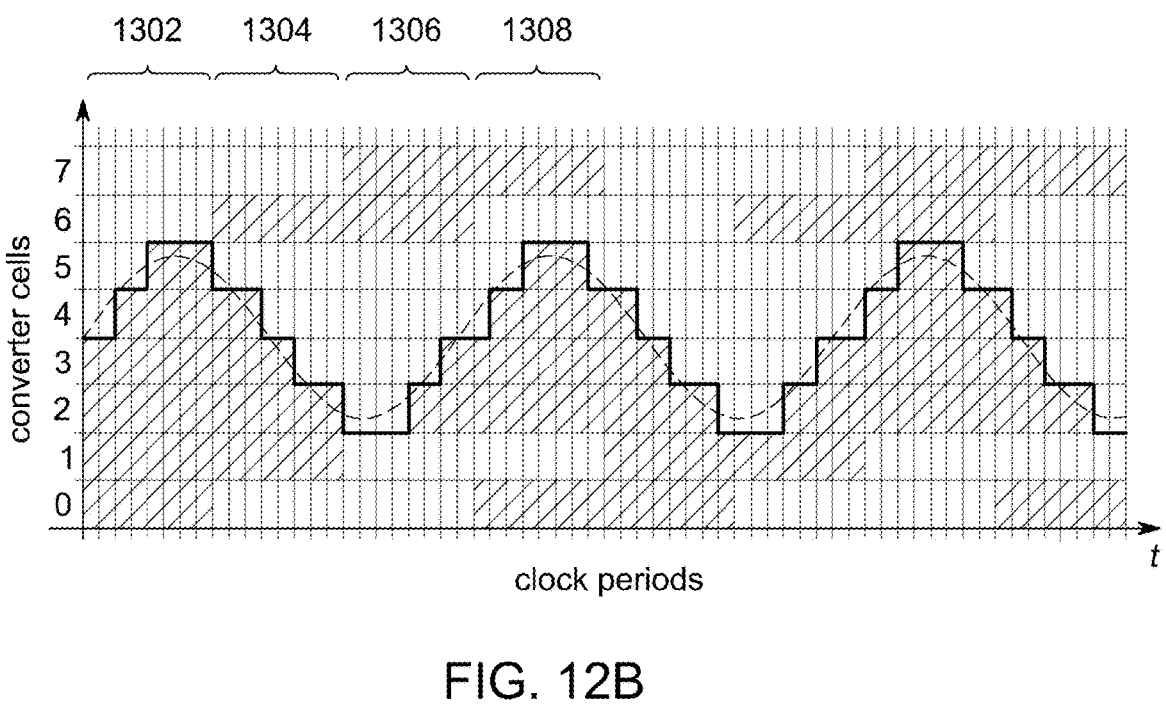

Alternatively, more advanced algorithms to switch the inactive cells may be used. FIG. 12B shows an example of signals and cell activity for the switching of inactive DAC cells where the state of the inactive cells is cyclically changed in different timing. In this example, without the cell state change, cells 0 and 1 will be activated at all times and cells 6 and 7 will be inactivated at all times. With the cell state change in accordance with this example, the states of the low-indexed cells (e.g., cells 0 and 1) and the high-indexed cells (e.g., cells 6 and 7) are switched periodically but at different timing. In this example, during the period 1302, cells 0 and 1 are activated and cells 6 and 7 are inactivated. During the period 1304, the status of cell 0 and cell 7 are switched such that cell 0 is inactivated and cell 7 is activated. During the period 1306, the status of cells 0 and 1 and cells 6 and 7 are switched such that cells 0 and 1 are activated and cells 6 and 7 are inactivated. During the period 1308, the status of cell 1 and cell 6 are switched such that cell 1 is inactivated and cell 6 is activated. The process then repeats. In addition, more complicated, random or noise shaping algorithms may also be employed.

In another example, the order (or logical indexing) of the individual DAC cells may be reversed periodically or at certain periods to avoid asymmetric NBTI stress. This scheme can be applied for both the standby state and the normal operation condition of the DAC. For examples, in a TDD operation, the transceiver switches the operation from transmission to reception and vice versa repeatedly. During reception periods, the transmitter and thus the DAC may be in a standby mode. The change of the DAC cell order in this example scheme may happen while the transceiver is receiving, or the transmitter (thus the DAC) is in a standby mode and not outputting any signal.

Figure 13A:
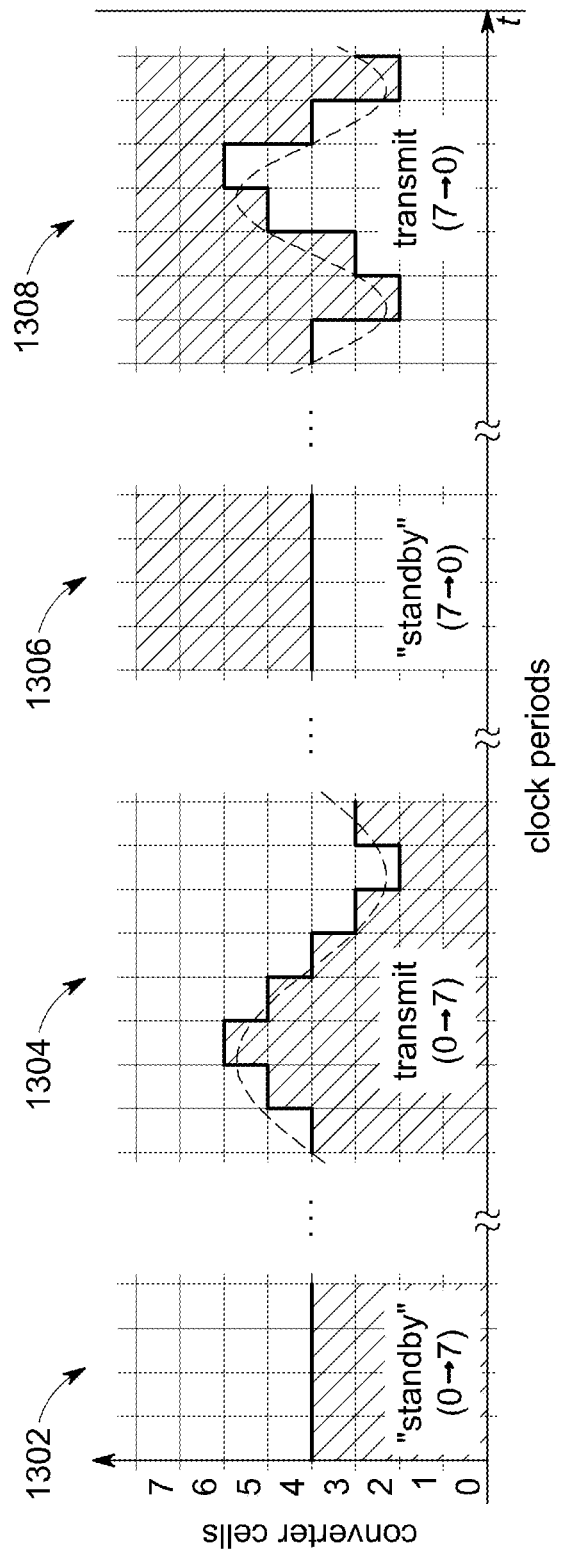
FIG. 13A-13D show examples of switching the order of the DAC cells periodically or at certain timing.

FIG. 13A shows an example of switching the order (or logical DAC cell indexing) of the DAC cells periodically or at certain timing. In the example shown in FIG. 13, the DAC allocates the DAC cells starting from the lowest-indexed cell (e.g., cell 0) toward the highest-indexed cell (cell 7) during the periods 1302 and 1304. After a predetermined period of time, the DAC changes the allocation scheme such that during the periods 1306 and 1308, the DAC allocates the DAC cells starting from the highest-indexed cell (e.g., cell 7) toward the lowest-indexed cell (cell 0). During the period 1302, the DAC is in a standby state and allocates four DAC cells (cells 0-3) starting from the lowest-indexed cell (e.g., cell 0) toward the highest-indexed cell (cell 7), and during the period 1304, the DAC is in a normal operation state and allocates DAC cells starting from the lowest-indexed cell (cell 0) toward the highest-indexed cell (cell 7). During the period 1306, the DAC is in a standby state and allocates 4

DAC cells (cells 4-7) starting from the highest-indexed cell (e.g., cell 7) toward the lowest-indexed cell (cell 0), and during the period 1308, the DAC is in a normal operation state and allocates DAC cells starting from the highest-indexed cell (cell 7) toward the lowest-indexed cell (cell 0).

Figure 13B:
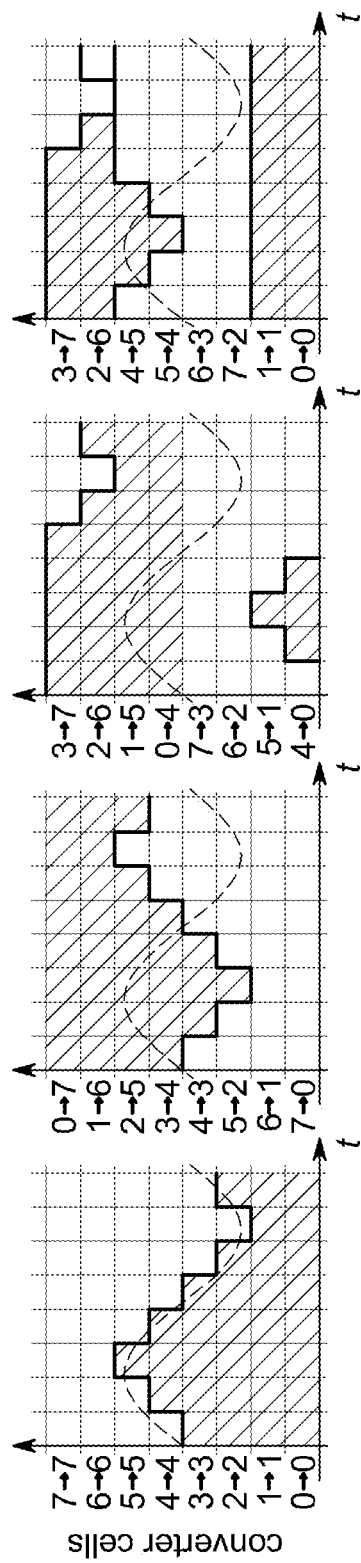
Figure 13C:
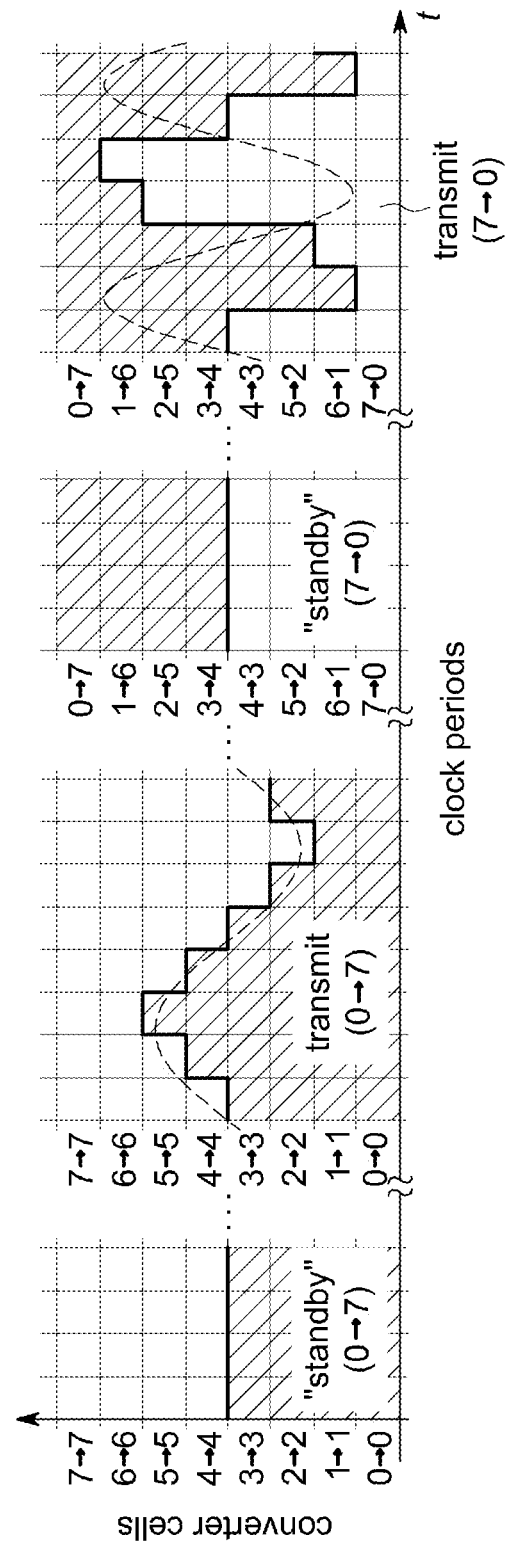
Figure 13D:
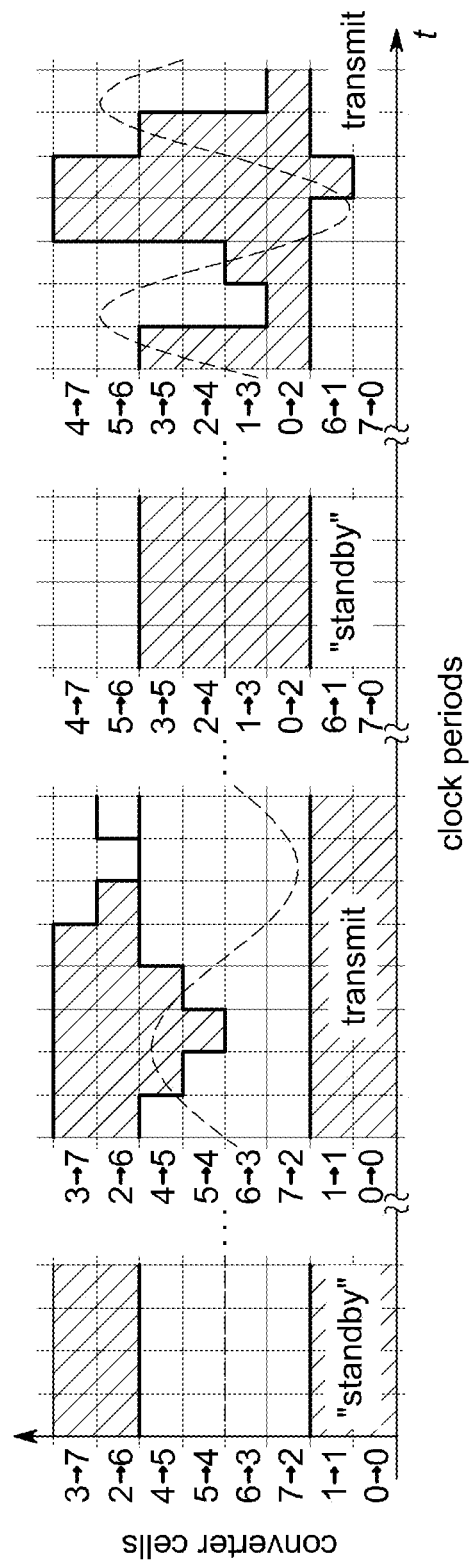

FIGS. 13B-13D show different examples of switching the DAC cells by changing logical DAC cell indexing of the DAC cells. FIG. 13B shows four (4) different DAC cell indexing for the same input during the normal operation of the DAC. FIGS. 13C and 13D show other examples for switching the DAC cells by changing logical DAC cell indexing during the standby mode and the normal operation of the DAC. FIG. 13C shows examples (the left two figures) that the DAC cells are allocated starting from the lowest-indexed cell (e.g., cell 0) toward the highest-indexed cell (cell 7), and examples (the right two figures) that the DAC cells are allocated starting from the highest-indexed cell (cell 7) toward the lowest-indexed cell (cell 0). FIG. 13D shows examples of using different indexing schemes to map different physical DAC cells to the logical DAC cells. As shown in FIGS. 13B-13D, different DAC cells may be selected to be active for different periods of time by changing the DAC cell indexing scheme.

The examples above were described with reference to unary-weighted DACs. The example schemes can be applied to binary-weighted DACs or any other weighting schemes as well. FIGS. 14A-14D show some examples for switching DAC cells for cell activity averaging for binary-weighted DACs.

Figures 14A, 14B:
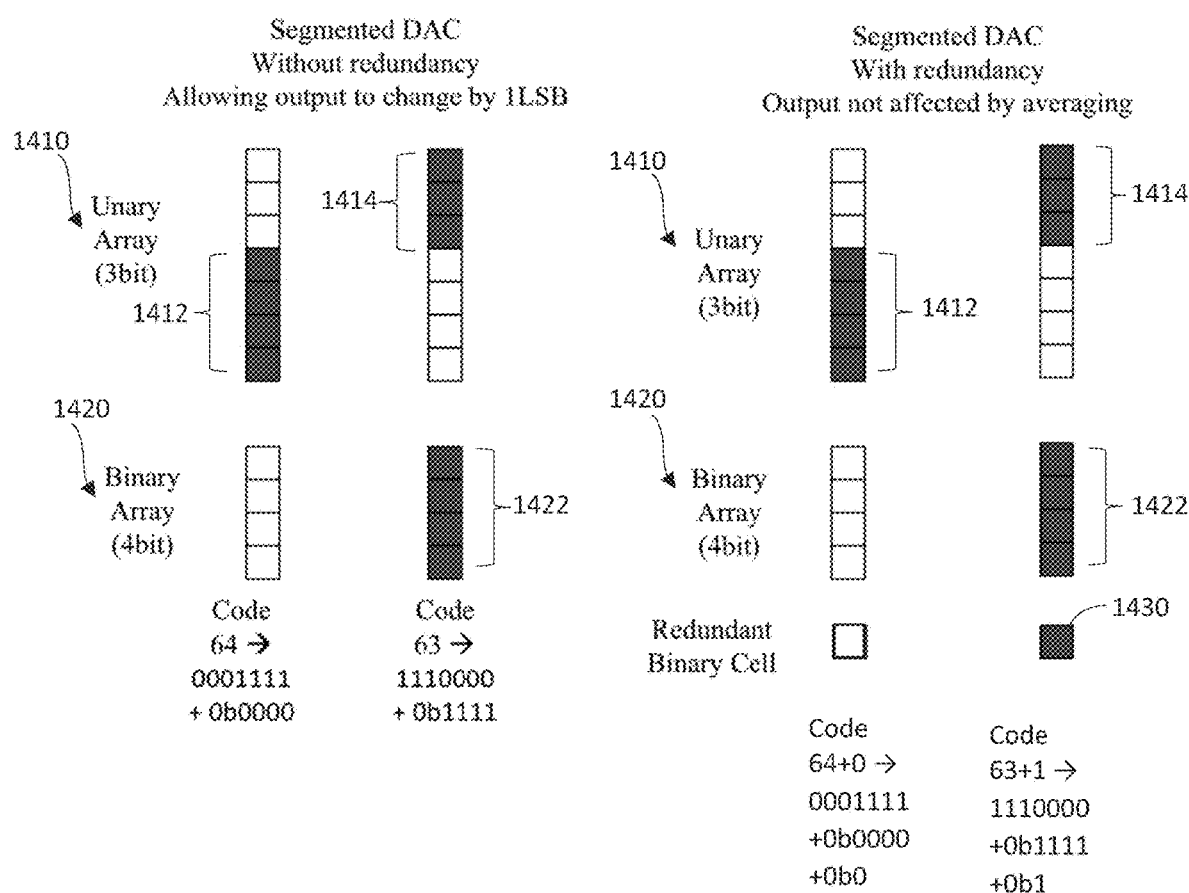
FIGS. 14A-14D show examples for cell activity averaging for binary-weighted DACs.

FIG. 14A shows an example for segmented DAC without a redundant DAC cell. In this example, the DAC cells are segmented into two segments (the unary array 1410 for 3 MSB bits and the binary array 1420 for 4 LSB bits). As an example, for the code 64, four unary DAC cells 1412 are active and no binary DAC cells 1414 are active (i.e., 0001111+0b0000) as shown on the left side of FIG. 14A, and for the next period, the active DAC cells are swapped/changed such that the other three unary DAC cells 1414 and all binary DAC cells 1424 are active (i.e., 1110000+0b1111) as shown on the right side of FIG. 14A. In this example, the output of the DAC changes by one LSB by changing/swapping the DAC cells.

FIG. 14B shows an example for segmented DAC with redundancy. In this example, the DAC cells are segmented into two segments (the unary array 1410 for 3 MSB bits and the binary array 1420 for 4 LSB bits) and there is one redundant binary DAC cell 1430. The weight of the redundant DAC cell 1430 is same as the LSB binary DAC cell. As an example, for the code 64, four unary DAC cells 1412 are active and the binary DAC cells including the redundant DAC cell are inactive (i.e., 0001111+0b0000+0b0) as shown on the left side of FIG. 14B, and for the next period, the active DAC cells are swapped/changed such that the other three unary DAC cells 1414 and all binary DAC cells 1422 and the redundant LSB binary DAC cell 1430 are active (i.e., 1110000+0b1111+0b1) as shown on the right side of FIG. 14B. In this example, the output of the DAC is not affected by changing/swapping the DAC cells.

Figures 14C, 14D:
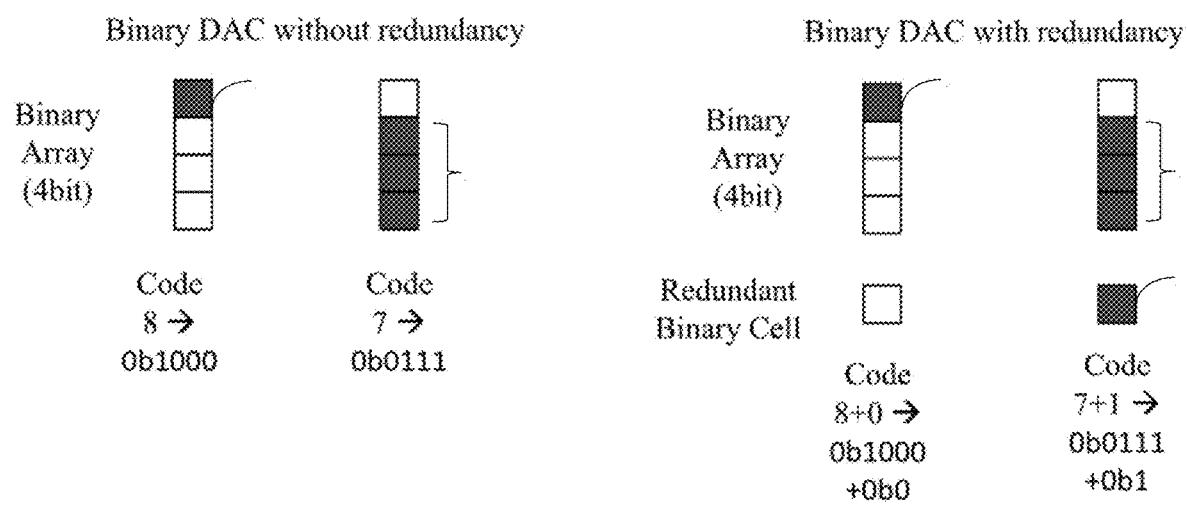

FIG. 14C shows an example for a binary-weighted DAC without redundancy. In this example, the DAC comprises a 4 binary DAC cells. As an example, for the code 8, the MSB DAC cell 1452 is active (i.e., 0b1000) as shown on the left side of FIG. 14C, and for the next period the DAC cells are swapped/changed such that for the same code 8, the other three binary DAC cells 1454 are active (i.e., 0b0111) as shown on the right side of FIG. 14C. In this example, the output of the DAC changes by one LSB by changing/swapping the DAC cells.

FIG. 14D shows an example for a binary-weighted DAC with redundancy. In this example, the DAC comprises a 4 binary DAC cells and one redundant DAC cell 1460. The weight of the redundant DAC cell 1460 is same as the LSB binary DAC cell. As an example, for the code 8, the MSB binary DAC cell 1452 is active (i.e., 0b1000+0b0) as shown on the left side of FIG. 14D, and for the next period the DAC cells are swapped/changed such that for the same code 8, the other three binary DAC cells 1454 and the redundant LSB binary DAC cell 1460 are active (i.e., 0b0111+0b1)) as shown on the right side of FIG. 14D. In this example, the output of the DAC is not affected by changing/swapping the DAC cells.

In transmitter systems, where high-performance DACs are employed, signal statistics and properties, such as the maximum amplitudes of a signal may be known before, e.g., for the duration of an orthogonal frequency division multiplex (OFDM) symbol, or the like. Thus, the number and position of the inactive DAC cells may be determined a priori and one of the example schemes disclosed above may be employed based on the determined number and position of the inactive DAC cells. Additionally, more complicated algorithms may be used, which do not require the knowledge of the signal's maximum amplitude and adapt to it during operation.

Figure 15A:
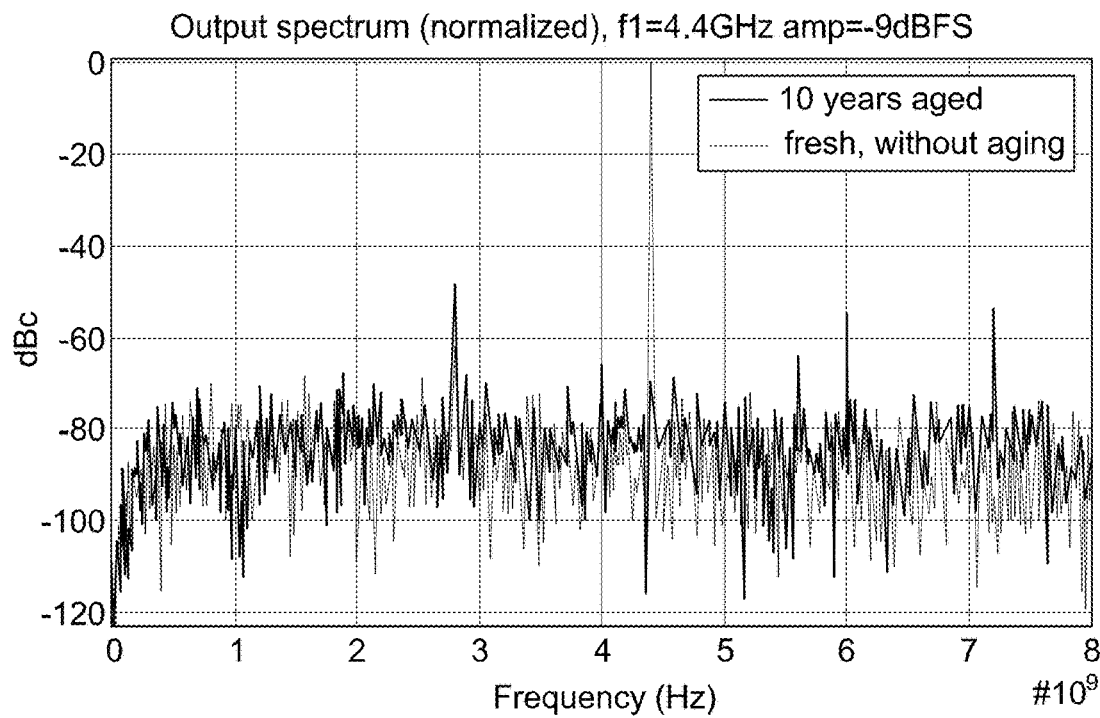
FIGS. 15A, 15B, 16A, and 16B show simulation results showing the impact of aging and stress effects applied and reduction of aging effects in accordance with the examples.

A high-performance DAC implemented in a 16 nm FinFET CMOS technology has been simulated with aging and stress effects applied. FIGS. 15A/15B and 16A/16B show the impact of aging and stress effects applied, comparing the DAC's output spectrum for a −9 dBFSrms dual tone signal at 4.4 GHz before and after ten years of aging in the standby mode without any NBTI mitigation applied.

Figure 15B:
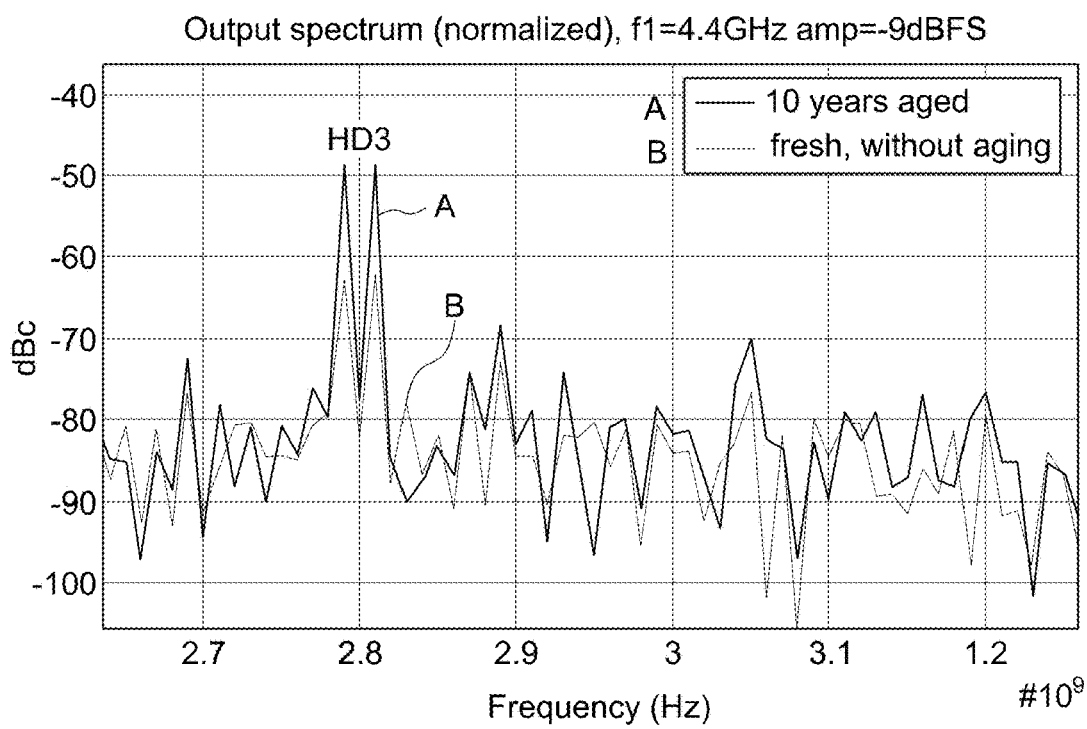

FIG. 15A shows a full spectrum and FIG. 15B shows zoom to the third harmonic. The simulation reveals a severe performance degradation after ten years of NBTI stress, since all the cells' PMOS transistors suffer NBTI stress asymmetrically. The third order harmonic distortion (HD3) is degraded by more than 13 dB, as is the spurious free dynamic range (SFDR) of the converter.

Figure 16A:
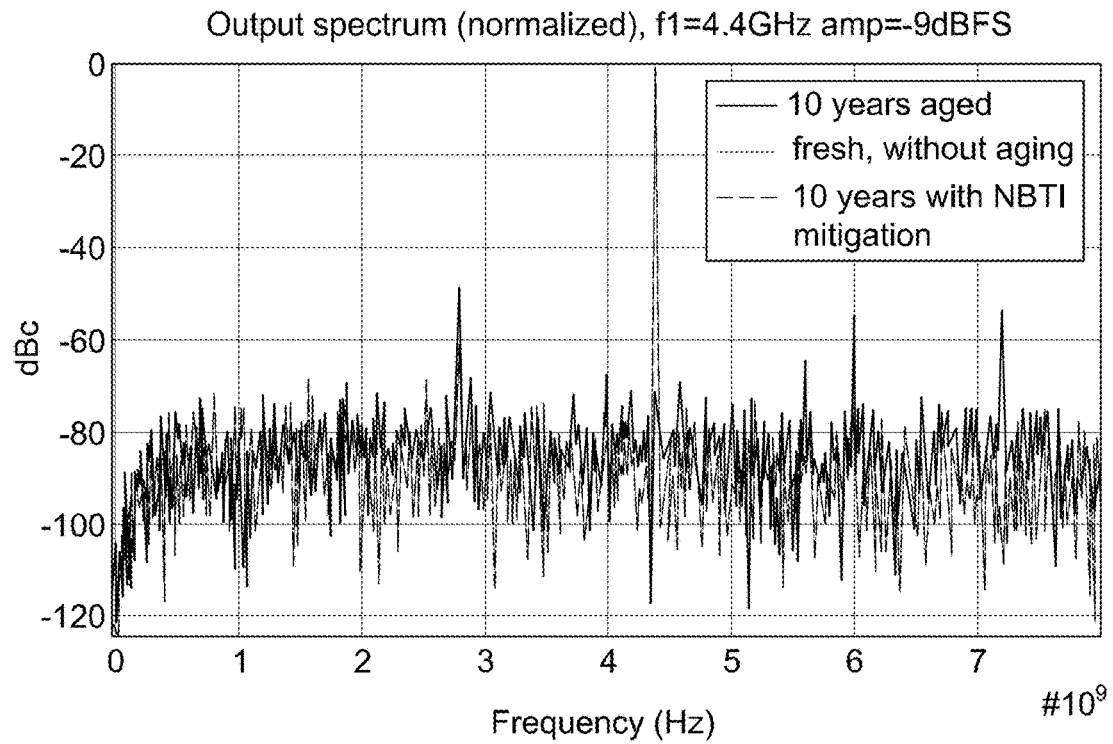
Figure 16B:
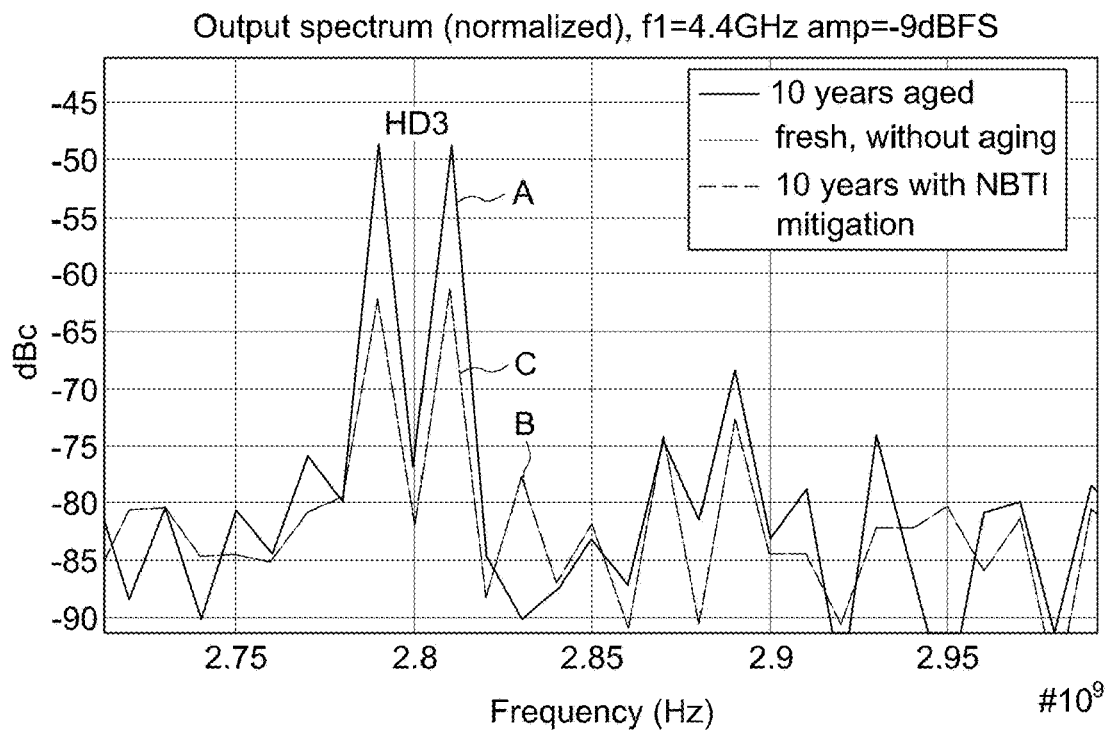

FIGS. 16A and 16B show the simulated output of the DAC for the same signal, when the NBTI mitigation for the standby mode is applied. FIG. 16A shows a full spectrum and FIG. 16B shows zoom to the third harmonic. The chosen idle frequency is $f_{idle}$=10 MHz, while the rotation increase $n_{idle}$ is half of the number of cells. As the simulation results show, the performance degradation due to ten years of aging in the DAC standby mode is less than 1 dB. The curves B and C for the results before and after aging in FIGS. 16A and 16B are almost perfectly overlapping. Thus, the effectiveness and feasibility of the disclosed schemes is demonstrated.

Figure 17:
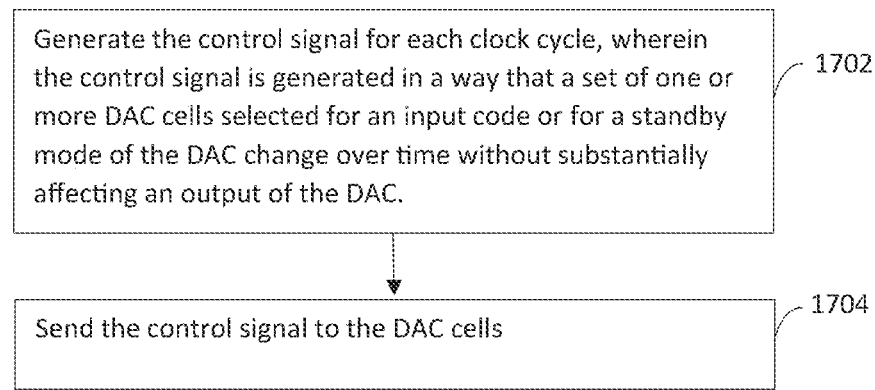
FIG. 17 is a flow diagram of an example process for reducing aging effects on components of a DAC.

FIG. 17 is a flow diagram of an example process for reducing aging effects on components of a DAC. The DAC comprises a plurality of DAC cells. Each DAC cell includes a capacitor and a driver. One terminal of each capacitor of the plurality of DAC cells is coupled to an output node in parallel and each driver of the plurality of DAC cells is configured to couple either a first reference voltage or a second reference voltage to the other terminal of a corresponding capacitor based on a control signal. The method includes generating the control signal for each clock cycle (1702). The control signal may be generated in a way that a set of one or more DAC cells selected for an input code or for a standby mode of the DAC change during a predetermined period of time without substantially affecting an output of the DAC (e.g., same or within a predetermined limit). The method further includes sending the control signal to the DAC cells (1704).

In the standby mode, the control signal may be generated in a way that the set of one or more DAC cells selected for a predetermined level of the output of the DAC change periodically. The control signal may be generated in a way that the set of one or more DAC cells selected among the plurality of DAC cells is cyclically shifted by a predetermined number of DAC cells or a random number of DAC cells periodically. The control signal may be generated in a way that the set of one or more DAC cells are alternatingly selected starting from a lowest-indexed DAC cell for one period of time and starting from a highest-indexed DAC cell for a subsequent period of time. During a normal operation of the DAC where the DAC generates the output based on the input code, the control signal may be generated in a way that one or more low-indexed DAC cells are swapped with one or more high-indexed DAC cells periodically. The control signal may be generated based on signal statistics and properties of an input signal.

Figure 18:
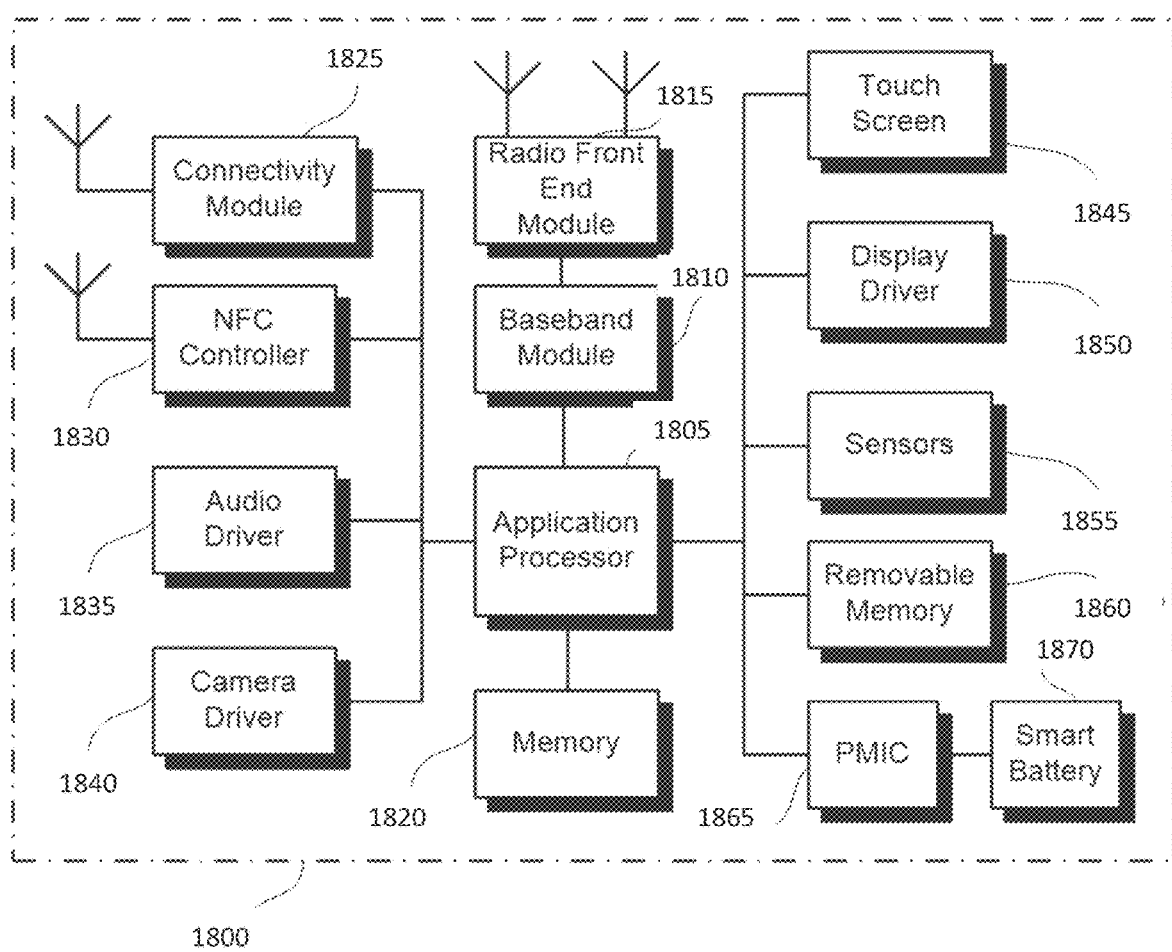
FIG. 18 illustrates a user device in which the examples disclosed herein may be implemented.

FIG. 18 illustrates a user device 1800 in which the examples disclosed herein may be implemented. For example, the examples disclosed herein may be implemented in the radio front-end module 1815, in the baseband module 1810, etc. The user device 1800 may be a mobile device in some aspects and includes an application processor 1805, baseband processor 1810 (also referred to as a baseband module), radio front end module (RFEM) 1815, memory 1820, connectivity module 1825, near field communication (NFC) controller 1830, audio driver 1835, camera driver 1840, touch screen 1845, display driver 1850, sensors 1855, removable memory 1860, power management integrated circuit (PMIC) 1865 and smart battery 1870.

In some aspects, application processor 1805 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1810 may be implemented, for example, as a solder-down substrate including one or more integrated circuits, a single packaged integrated circuit soldered to a main circuit board, and/or a multi-chip module containing two or more integrated circuits.

Figure 19:
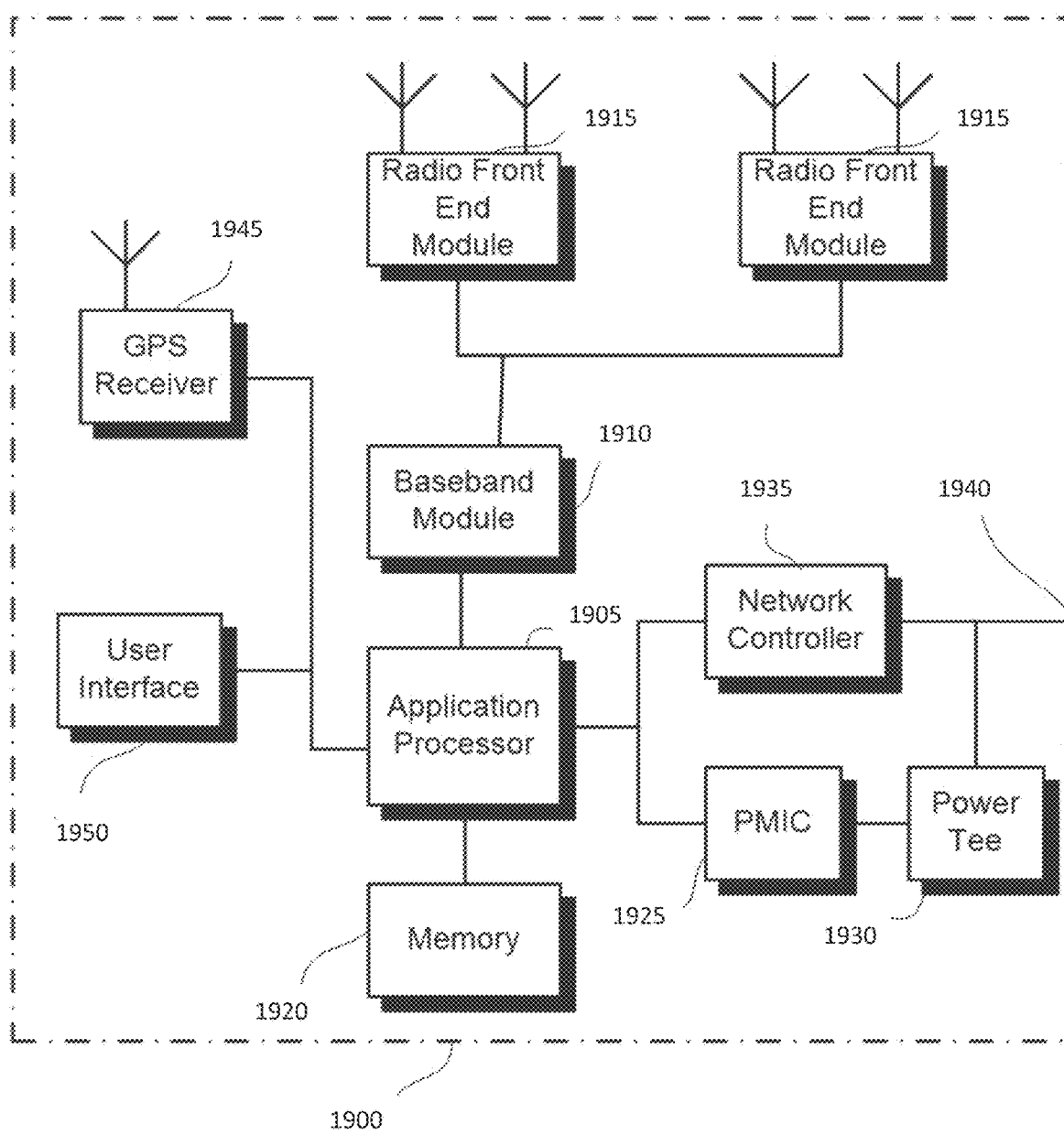
FIG. 19 illustrates a base station or infrastructure equipment radio head in which the examples disclosed herein may be implemented.

FIG. 19 illustrates a base station or infrastructure equipment radio head 1900 in which the examples disclosed herein may be implemented. For example, the examples disclosed herein may be implemented in the radio front-end module 1915, in the baseband module 1910, etc. The base station radio head 1900 may include one or more of application processor 1905, baseband modules 1910, one or more radio front end modules 1915, memory 1920, power management circuitry 1925, power tee circuitry 1930, network controller 1935, network interface connector 1940, satellite navigation receiver module 1945, and user interface 1950.

In some aspects, application processor 1905 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1910 may be implemented, for example, as a solder-down substrate including one or more integrated circuits, a single packaged integrated circuit soldered to a main circuit board or a multi-chip module containing two or more integrated circuits.

In some aspects, memory 1920 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1920 may be implemented as one or more of solder down packaged integrated circuits, socketed memory modules and plug-in memory cards.

In some aspects, power management integrated circuitry 1925 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1930 may provide for electrical power drawn from a network cable to provide both power supply and data connectivity to the base station radio head 1900 using a single cable.

In some aspects, network controller 1935 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1945 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1945 may provide data to application processor 1905 which may include one or more of position data or time data. Application processor 1905 may use time data to synchronize operations with other radio base stations.

In some aspects, user interface 1950 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to a DAC. The DAC includes a plurality of DAC cells, and a controller configured to generate a control signal for driving the plurality of DAC cells for each clock cycle, wherein the controller is configured to generate the control signal to select a set of at least one DAC cell for an input code or for a standby mode of the DAC such that the selected set of at least one DAC cell to be active for the same input code or for the standby mode of the DAC change during a predetermined period of time, wherein an output of the DAC is less than or equal to a predefined threshold.

Another example (e.g., example 2) relates to a previously described example (e.g., example 1), further comprising at least one redundant DAC cell, wherein the controller is configured to generate the control signal to select the set of at least one DAC cell to be active for the input code or for the standby mode of the DAC including the at least one redundant DAC cell.

Another example (e.g., example 3) relates to a previously described example (e.g., example 2), wherein the DAC cells are either binary-weighted or unary-weighted.

Another example (e.g., example 4) relates to a previously described example (e.g., any one of examples 1-3), wherein, in the standby mode, the controller is configured to generate the control signal in a way that the set of at least one DAC cell selected for a predetermined level of the output of the DAC changes during the predetermined period of time.

Another example (e.g., example 5) relates to a previously described example (e.g., example 4), wherein the controller is configured to generate the control signal in a way that the set of at least one DAC cell selected among the plurality of DAC cells is cyclically shifted by a predetermined number of DAC cells periodically.

Another example (e.g., example 6) relates to a previously described example (e.g., example 5), wherein the controller is configured to generate the control signal in a way that the set of at least one DAC cell selected among the plurality of DAC cells is cyclically shifted by a random number of DAC cells periodically.

Another example (e.g., example 7) relates to a previously described example (e.g., any one of examples 4-6), wherein during the standby mode, the controller is configured to alternatingly select the set of at least one DAC cell starting from a lowest-indexed DAC cell for one period of time and starting from a highest-indexed DAC cell for a subsequent period of time or change DAC cell indexing such that the set of at least one DAC cell selected for a predetermined level of the output of the DAC change during the predetermined period of time.

Another example (e.g., example 8) relates to a previously described example (e.g., any one of examples 1-7), wherein during a normal operation of the DAC where the DAC generates the output based on the input code, the controller is configured to generate the control signal in a way that one or more low-indexed DAC cells are swapped with one or more high-indexed DAC cells over time or change DAC cell indexing such that the selected set of at least one DAC cell to be active for the same input code change during the predetermined period of time.

Another example (e.g., example 9) relates to a previously described example (e.g., example 8), wherein in case two or more low-indexed DAC cells are swapped with two or more high-indexed DAC cells, the two or more low-indexed DAC cells and the two or more high-indexed DAC cells are swapped at the same time.

Another example (e.g., example 10) relates to a previously described example (e.g., any one of examples 8-9), wherein in case two or more low-indexed DAC cells are swapped with two or more high-indexed DAC cells, each of the two or more low-indexed DAC cells and each of the two or more high-indexed DAC cells are swapped at different times.

Another example (e.g., example 11) relates to a previously described example (e.g., any one of examples 8-10), wherein the controller is configured to generate the control signal based on signal statistics and properties of an input signal.

Another example (e.g., example 12) relates to a previously described example (e.g., any one of examples 8-11), wherein the controller is configured to alternatingly select the set of at least one DAC cell starting from a lowest-indexed DAC cell for one period of time and starting from a highest-indexed DAC cell for a subsequent period of time.

Another example (e.g., example 13) relates to a previously described example (e.g., any one of examples 1-12), wherein the plurality of DAC cells are segmented into two or more segments, and DAC cells in at least one segment is unary coded.

Another example (e.g., example 14) relates to a previously described example (e.g., any one of examples 1-13), wherein the driver is an inverter-based driver.

Another example (e.g., example 15) relates to a method for reducing aging effects on components of a DAC, wherein the DAC comprises a plurality of DAC cells. The method includes generating a control signal for driving the plurality of DAC cells for each clock cycle, wherein the control signal is generated to select a set of at least one DAC cell for an input code or for a standby mode of the DAC such that the selected set of at least one DAC cell to be active for the same input code or for the standby mode of the DAC change during a predetermined period of time, wherein an output of the DAC is less than or equal to a predefined threshold.

Another example (e.g., example 16) relates to a previously described example (e.g., example 15), wherein the DAC comprises at least one redundant DAC cell, wherein the control signal is generated to select the set of at least one DAC cell to be active for the input code or for the standby mode of the DAC including the at least one redundant DAC cell.

Another example (e.g., example 17) relates to a previously described example (e.g., any one of examples 15-16), wherein the DAC cells are either binary-weighted or unary-weighted.

Another example (e.g., example 18) relates to a previously described example (e.g., any one of examples 15-17), wherein, in the standby mode, the control signal is generated in a way that the set of at least one DAC cell selected for a predetermined level of the output of the DAC change during the predetermined period of time.

Another example (e.g., example 19) relates to a previously described example (e.g., any one of examples 18), wherein the control signal is generated in a way that the set of at least one DAC cell selected among the plurality of DAC cells is cyclically shifted by a predetermined number of DAC cells or a random number of DAC cells periodically.

Another example (e.g., example 20) relates to a previously described example (e.g., any one of examples 15-19), wherein the control signal is generated in a way that the set of at least one DAC cell are alternatingly selected starting from a lowest-indexed DAC cell for one period of time and starting from a highest-indexed DAC cell for a subsequent period of time.

Another example (e.g., example 21) relates to a previously described example (e.g., any one of examples 15-20), wherein during a normal operation of the DAC where the DAC generates the output based on the input code, the control signal is generated in a way that one or more low-indexed DAC cells are swapped with one or more high-indexed DAC cells or DAC cell indexing is changed such that the selected set of one or more DAC cells to be active for the same input code change during the predetermined period of time.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digital-to-analog converter (DAC) comprising:
a plurality of DAC cells; and
a controller configured to generate a control signal to drive the plurality of DAC cells for each clock cycle, wherein the controller is configured to generate the control signal to select a set of at least one DAC cell for an input code or for a standby mode of the DAC such that the selected set of at least one DAC cell to be active for the same input code or for the standby mode of the DAC change during a predetermined period of time, wherein an output of the DAC is less than or equal to a predefined threshold,
wherein during a normal operation of the DAC where the DAC generates the output based on the input code, the controller is configured to generate the control signal in a way that one or more low-indexed DAC cells are swapped with one or more high-indexed DAC cells such that the selected set of at least one DAC cell to be active for the same input code changes during the predetermined period of time.

2. The DAC of claim 1, further comprising at least one redundant DAC cell, wherein the controller is configured to generate the control signal to select the set of at least one DAC cell to be active for the input code or for the standby mode of the DAC including the at least one redundant DAC cell.

3. The DAC of claim 2, wherein the DAC cells are either binary-weighted or unary-weighted.

4. The DAC of claim 1, wherein, in the standby mode, the controller is configured to generate the control signal in a way that the set of at least one DAC cell selected for a predetermined level of the output of the DAC changes during the predetermined period of time.

5. The DAC of claim 4, wherein the controller is configured to generate the control signal in a way that the set of at least one DAC cell selected among the plurality of DAC cells is cyclically shifted by a predetermined number of DAC cells periodically.

6. The DAC of claim 5, wherein the controller is configured to generate the control signal in a way that the set of at least one DAC cell selected among the plurality of DAC cells is cyclically shifted by a random number of DAC cells periodically.

7. The DAC of claim 4, wherein during the standby mode, the controller is configured to alternatingly select the set of at least one DAC cell starting from a lowest-indexed DAC cell for one period of time and starting from a highest-indexed DAC cell for a subsequent period of time or change DAC cell indexing such that the set of at least one DAC cell selected for a predetermined level of the output of the DAC changes during the predetermined period of time.

8. The DAC of claim 1, wherein in case two or more low-indexed DAC cells are swapped with two or more high-indexed DAC cells, the two or more low-indexed DAC cells and the two or more high-indexed DAC cells are swapped at the same time.

9. The DAC of claim 1, wherein in case two or more low-indexed DAC cells are swapped with two or more high-indexed DAC cells, each of the two or more low-indexed DAC cells and each of the two or more high-indexed DAC cells are swapped at different times.

10. The DAC of claim 1, wherein the controller is configured to generate the control signal based on signal statistics and properties of an input signal.

11. The DAC of claim 1, wherein the controller is configured to alternatingly select the set of at least one DAC cell starting from a lowest-indexed DAC cell for one period of time and starting from a highest-indexed DAC cell for a subsequent period of time.

12. The DAC of claim 1, wherein the plurality of DAC cells are segmented into two or more segments, and DAC cells in at least one segment is unary coded.

13. The DAC of claim 1, wherein the driver is an inverter-based driver.

14. A method for reducing aging effects on components of a digital-to-analog converter (DAC), wherein the DAC comprises a plurality of DAC cells, the method comprising:
generating a control signal for driving the plurality of DAC cells for each clock cycle, wherein the control signal is generated to select a set of at least one DAC cell for an input code or for a standby mode of the DAC such that the selected set of at least one DAC cell to be active for the same input code or for the standby mode of the DAC change during a predetermined period of time, wherein an output of the DAC is less than or equal to a predefined threshold; and
sending the control signal to the DAC cells,
wherein during a normal operation of the DAC where the DAC generates the output based on the input code, the control signal is generated in a way that one or more low-indexed DAC cells are swapped with one or more high-indexed DAC cells such that the selected set of at least one DAC cell to be active for the same input code changes during the predetermined period of time.

15. The method of claim 14, wherein the DAC comprises at least one redundant DAC cell, wherein the control signal is generated to select the set of at least one DAC cell to be active for the input code or for the standby mode of the DAC including the at least one redundant DAC cell.

16. The method of claim 14, wherein the DAC cells are either binary-weighted or unary-weighted.

17. The method of claim 14, wherein, in the standby mode, the control signal is generated in a way that the set of at least one DAC cell selected for a predetermined level of the output of the DAC changes during the predetermined period of time.

18. The method of claim 17, wherein the control signal is generated in a way that the set of at least one DAC cell selected among the plurality of DAC cells is cyclically shifted by a predetermined number of DAC cells or a random number of DAC cells periodically.

19. The method of claim 14, wherein the control signal is generated in a way that the set of at least one DAC cell is alternatingly selected starting from a lowest-indexed DAC cell for one period of time and starting from a highest-indexed DAC cell for a subsequent period of time.

* * * * *